(12) United States Patent
Makino et al.

(10) Patent No.: US 7,732,930 B2
(45) Date of Patent: Jun. 8, 2010

(54) SEMICONDUCTOR DEVICE, RELAY CHIP, AND METHOD FOR PRODUCING RELAY CHIP

(75) Inventors: Eiichi Makino, Yokohama (JP); Shigeo Ohshima, Kawasaki (JP); Naohisa Okumura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 11/851,118

(22) Filed: Sep. 6, 2007

(65) Prior Publication Data

US 2008/0054491 A1  Mar. 6, 2008

(30) Foreign Application Priority Data

Sep. 6, 2006 (JP) .............................. 2006-241656
Oct. 17, 2006 (JP) .............................. 2006-282693

(51) Int. Cl.
*H01L 23/48* (2006.01)
*H01L 23/52* (2006.01)
*H01L 29/40* (2006.01)

(52) U.S. Cl. ....................... 257/777; 257/686; 257/724; 257/784; 257/E23.004

(58) Field of Classification Search ................ 257/686, 257/723, 724, 777, 784, E23.004
See application file for complete search history.

(56) References Cited

U.S. PATENT DOCUMENTS 5,329,157 A * 7/1994 Rosotker .................... 257/666

| 5,976,911 A | 11/1999 | Bruce et al. |
| 6,836,010 B2 | 12/2004 | Saeki |
| 6,958,532 B1 | 10/2005 | Nakayama |
| 7,009,303 B2 | 3/2006 | Kuroda et al. |
| 7,064,444 B2 | 6/2006 | Lee et al. |
| 7,087,844 B2 | 8/2006 | Ishimaru et al. |

FOREIGN PATENT DOCUMENTS

| JP | 2004-056023 | 2/2004 |
| JP | 2004-327993 | 11/2004 |

* cited by examiner

*Primary Examiner*—David A Zarneke
*Assistant Examiner*—Jenny L Wagner
(74) *Attorney, Agent, or Firm*—Oblon, Spivak, McClelland, Maier & Neustadt, L.L.P.

(57) ABSTRACT

A semiconductor device including a circuit substrate including n number of terminals; a semiconductor chip provided on the circuit substrate and including n number of terminals; and a relay chip including a triangular substrate having a first side, a second side and a third side which form triangle, n number of first terminals located along the first side, n number of second terminals located along the second side, and a plurality of wires connecting the first terminals and the second terminals respectively; a first wire connecting each of the n number of terminals of the circuit substrate to a corresponding first terminal among the n number of first terminals; and a second wire connecting each of the n number of terminals of the semiconductor chip to a corresponding second terminal among the n number of second terminals.

11 Claims, 26 Drawing Sheets

1 : Direction conversion chip
2a, 2b : Bonding pad

F I G. 1 2
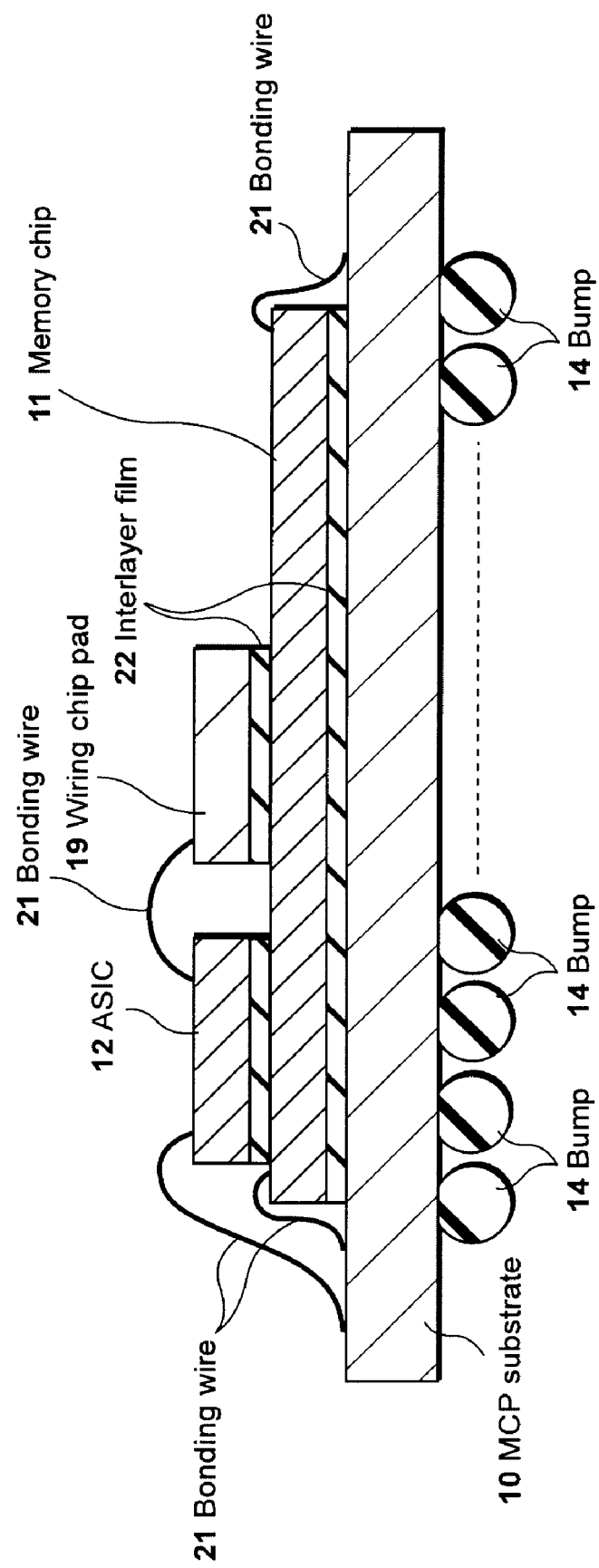

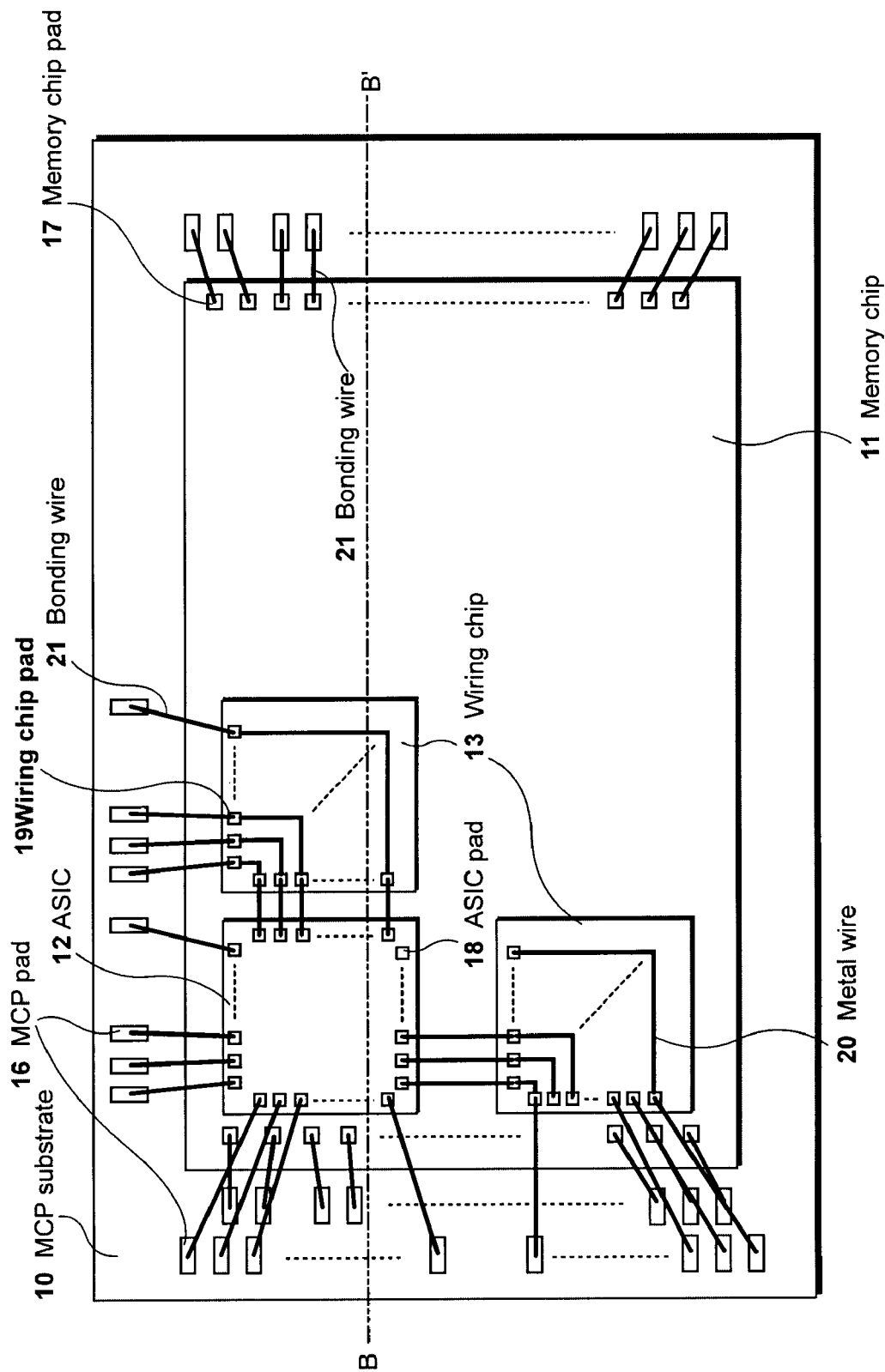

F I G. 1 8
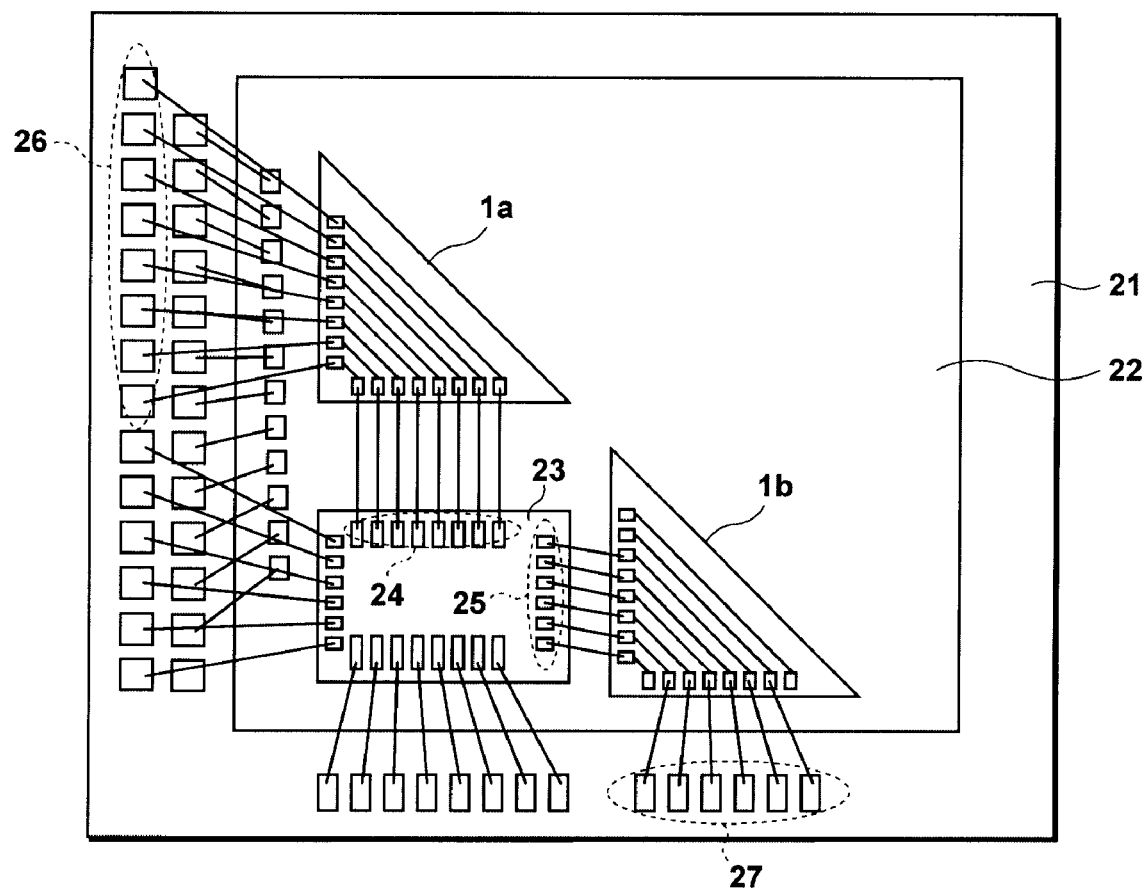

F I G. 2 4
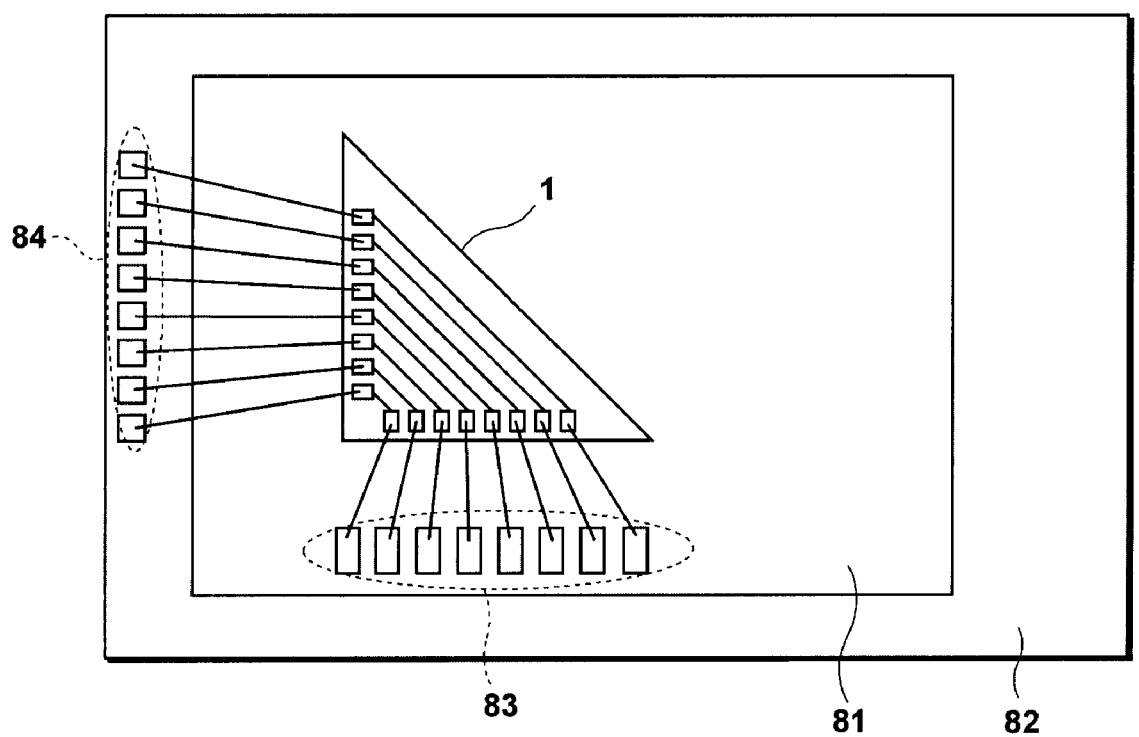

SEMICONDUCTOR DEVICE, RELAY CHIP, AND METHOD FOR PRODUCING RELAY CHIP

CROSS REFERENCE TO RELATED APPLICATIONS

This application is based upon and claims the benefit of priority from the prior Japanese Patent Application No. 2006-241656, filed on Sep. 6, 2006; and Japanese Patent Application No. 2006-282693, filed on Oct. 17, 2006; the entire contents of which are incorporated herein by reference.

BACKGROUND OF THE INVENTION

1. Field of the Invention

The present invention relates to a multi-chip package (hereinafter, referred to as the "MCP") encapsulating a plurality of semiconductor chips in one package, and specifically to a technology for reducing the wiring capacitance of a wiring chip used for wire-bonding the plurality of semiconductor chips.

2. Description of the Related Art

Recently, MCPs encapsulating a plurality of semiconductor chips for different purposes in one package are widely used. For example, a plurality of memory chips for different purposes are stacked on one MCP substrate, and an ASIC (Application Specific Integrated Circuit), for example, a memory controller or other devices are stacked thereon. For stacking elements in an MCP, it is common to use wire bonding for connecting a memory chip and an ASIC.

However, wire bonding involves limitations such as the wire length or the like. In addition, where a memory chip has a large size, it is difficult to connect an ASIC stacked on the memory chip directly to the MCP substrate by wiring. Therefore, a wiring chip is generally used as described in Japanese Laid-Open Patent Publication No. 2004-327993.

The wire used for wire bonding can be bent into a loop in a height direction (the direction vertical to a joint plane at which the semiconductor chip is jointed with the circuit substrate), but cannot be bent into a loop in a transverse direction (the direction parallel to the joint plane). Therefore, a relay chip for direction conversion is used as described in Japanese Laid-Open Patent Publication No. 2004-056023.

BRIEF SUMMARY OF THE INVENTION

A semiconductor device according to one embodiment of the present invention includes:

a substrate including a plurality of first pads thereon;

at least one semiconductor chip including a plurality of second pads; and at least one wiring chip including a plurality of third pads; wherein:

a part of the plurality of second pads of the semiconductor chip is electrically connected to a part of the plurality of third pads of the wiring chip, and another part of the plurality of third pads of the wiring chip is electrically connected to a part of the plurality of first pads of the substrate;

the plurality of third pads of the wiring chip are located along two adjacent sides of a wiring chip substrate of the wiring chip, and are connected to each other by a plurality of metal wires, sequentially from the third pads closest from a contact point of the two sides;

the plurality of metal wires each include a first part drawn from each of the plurality of third pads located along a first side of the two sides inward the wiring chip so as to be parallel to, or so as to form an acute angle with, a second side of the two sides, a second part drawn from each of the plurality of third pads located along the second side inward the wiring chip so as to be parallel to, or so as to form an acute angle with, the first side, and a third part connecting the first part and the second part to each other in a straight manner; and the plurality of metal wires are formed such that a wiring width of each metal wire, a wiring interval between each metal wire and a metal wire adjacent and outer thereto, and a wiring pitch which is a sum of each wiring width and a corresponding wiring interval are set so as to minimize a difference between wiring capacitances of each adjacent metal wires among the plurality of metal wires.

A semiconductor device according to one embodiment of the present invention includes:

a circuit substrate including at least n (n is an integer of two or greater) number of terminals;

a semiconductor chip provided on the circuit substrate and including at least n number of terminals; and a relay chip including a triangular substrate having a first side, a second side and a third side, at least n number of first terminals located along the first side, at least n number of second terminals located along the second side, and a plurality of wires connecting the first terminals and the second terminals respectively;

a first wire connecting each of the at least n number of terminals of the circuit substrate to a corresponding first terminal among the at least n number of first terminals; and a second wire connecting each of the at least n number of terminals of the semiconductor chip to a corresponding second terminal among the at least n number of second terminals.

A relay chip according to one embodiment of the present invention includes:

a triangular substrate having a first side, a second side, and a third side;

at least n (n is an integer of two or greater) number of first terminals located along the first side;

at least n number of second terminals located along the second side; and a plurality of wires connecting the first terminals and the second terminals respectively.

A method for producing a relay chip according to one embodiment of the present invention includes:

providing at least n (n is an integer of two or greater) number of terminals located along a first side of a quadrangular wafer having the first side, a second side facing the first side, a third side and a fourth side facing the third side, at least n number of second terminals located along the second side, at least n number of third terminals located along the third side, at least n number of fourth terminals located along the fourth side, a metal wire connecting each of the at least n number of first terminals to a corresponding fourth terminal among the at least n number of fourth terminals, and a metal wire connecting each of the at least n number of second terminals to a corresponding third terminal among the at least n number of third terminals; and cutting the wafer along a line connecting an intersection of the first side and the third side with an intersection of the second side and the fourth side.

BRIEF DESCRIPTION OF THE DRAWINGS

FIG. 12 is a cross-sectional view of a semiconductor device including one ASIC and one memory chip;

FIG. 13 is a plan view of a semiconductor device including an ASIC, a plurality of memory chips, and a plurality of wiring chips mounted on one substrate;

FIG. 18 is a view showing a schematic structure of a semiconductor device according to the eighth embodiment of the present invention;

FIG. 24 is a view showing a schematic structure of a semiconductor device according to the eighth embodiment of the present invention;

DETAILED DESCRIPTION OF THE INVENTION

Figure 1:
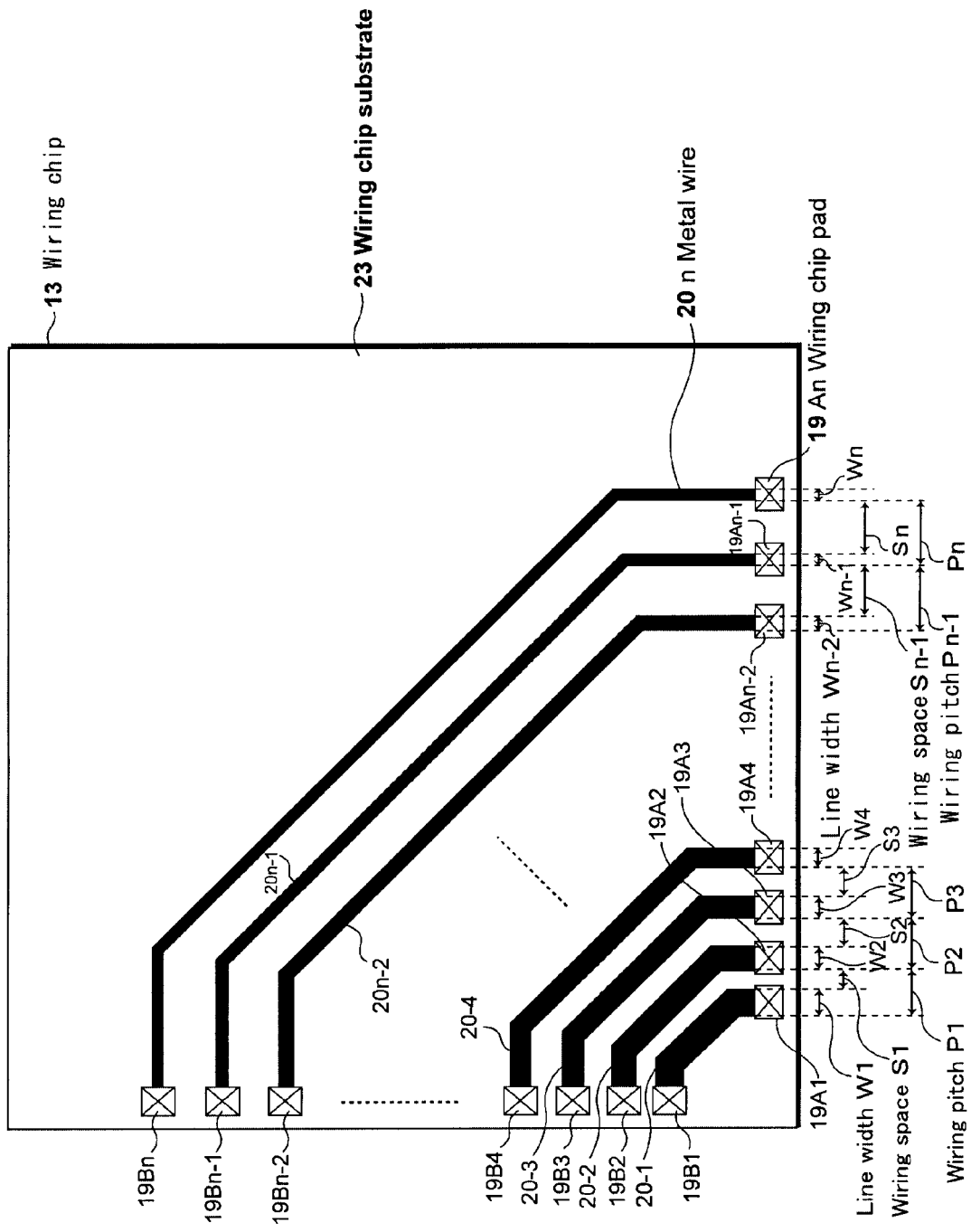
FIG. 1 is a plan view showing a wiring pattern of a wiring chip of a semiconductor device according to a first embodiment of the present invention.

Hereinafter, an MCP according to a first embodiment of the present invention will be described in detail with reference to the drawings. The following embodiments illustrate non-limiting examples of the semiconductor device according to one embodiment of the present invention.

First Embodiment

Recently, as compact mobile devices represented by cellular phones have rapidly been spread, the importance of an MCP product capable of reducing the mounting area has been increased. An MCP product includes a plurality of memory chips for different purposes and an ASIC such as a memory controller, which are stacked on an MCP substrate. When stacking the elements in the MCP, it is common to use wire bonding for connecting a memory chip and an ASIC.

For using wire bonding, it is common to use a wiring chip because wire bonding involves limitations such as the wire length or the like, and where a memory chip has a large size, it is difficult to connect an ASIC stacked on the memory chip directly to the MCP substrate by wiring.

Wiring will be described with reference to FIG. 12. FIG. 12 is a cross-sectional view of an MCP including one ASIC 12 and one memory chip 11. In this example, the memory chip 11 is provided on an MCP substrate, and the ASIC 12 as a memory controller and a wiring chip 13 are provided on the memory chip 11. On a bottom surface of the MCP substrate 10, projection card connection electrode bumps 14 (hereinafter, referred to as the "bumps 14") for directly connecting electrodes are provided. The memory chip is stacked on the MCP substrate 10 with an interlayer film 22 being interposed therebetween, and the ASIC 12 and the wiring chip 13 are stacked on the memory chip 11 with an interlayer film 22 being interposed therebetween. The memory chip 11, the ASIC 12 and the wiring chip 13 are each electrically connected to the MCP substrate 10 by a bonding wire 21. The ASIC and the wiring chip 13 are also electrically connected to each other by a bonding wire 21.

Figure 14:
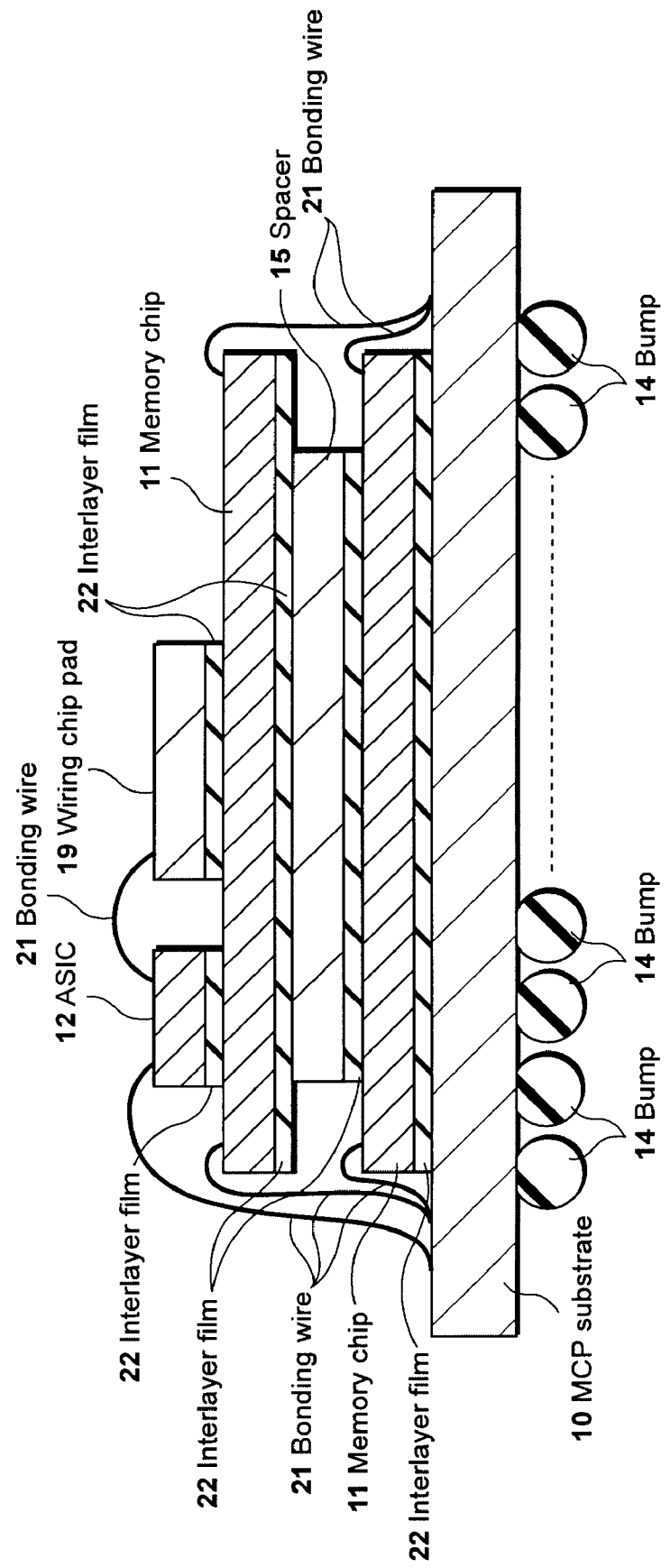
FIG. 14 is a cross-sectional view of the semiconductor device shown in FIG. 13 taken along line B-B'.

FIG. 13 is a plan view of an MCP including an ASIC, a plurality of memory chips and a plurality of wiring chips mounted on one substrate. FIG. 14 is a cross-sectional view of the MCP shown in FIG. 13 taken along line B-B'. As shown in FIG. 13 and FIG. 14, in this structure, two memory chips (upper memory chip and lower memory chip) 11 are mounted on the MCP substrate 10, and an ASIC 12 for a controller and two wiring chips 13 are mounted on the upper memory chip 11. On a bottom surface of the MCP substrate 10, bumps 14 for directly connecting electrodes are provided. The lower memory chip is stacked on the MCP substrate 10 with an interlayer film 22 being interposed therebetween, and the ASIC 12 and the wiring chips 13 are stacked on the upper memory chip 11 with an interlayer film 22 being interposed therebetween. Between the two memory chips 11, a spacer 11 is located with an interlayer film 22 being provided on and below the spacer 11.

As shown in FIG. 13, each memory chip 11 and the MCP substrate 10 are electrically connected to each other by bonding wires 21, each of which electrically connects a memory chip pad 17 of the memory chip 11 and an MCP pad 16 of the MCP substrate 10. The ASIC 12 and the MCP substrate 10 are electrically connected to each other by bonding wires 21, each of which electrically connects an ASIC pad 18 of the ASIC 12 and an MCP pad 16. Each wiring chip 13 and the MCP substrate 10 are electrically connected to each other by bonding wires 21, each of which electrically connects a wiring chip pad 19 of the wiring chip 13 and an MCP pad 16. The ASIC 12 and each wiring chip 13 are electrically connected to each other by bonding wires 21, each of which electrically connects an ASIC pad 18 and a wiring chip pad 19.

As shown here, in the MCP, the MCP substrate 10 needs to be electrically connected with each memory chip 11, the ASIC 12 and the like by a bonding wire 21 when these elements are mounted on the MCP substrate 10. In this case, especially where the ASIC 12 and the memory chips 11 have a large chip size, the wiring distance between the ASIC 12 and the MCP substrate 10 is very long, which makes connection difficult. Without the wiring chips 13, when the ASIC 12 is located at the center of the memory chip 11, the wiring distance between the ASIC pads 18 and the MCP pads 16 on the top side can be about the same as the wiring distance on the bottom side, and the wiring distance on the right side can be about the same as the wiring distance on the left side. However, due to the long wiring distance on the right side and the left side, the length of the bonding wires 21 is long. By contrast, when the ASIC 12 is located in the vicinity of one of the corners of the memory chip 11, the wiring distance can be short on one of the top, bottom, left and right sides (for example, on the left side), but the wiring distance on the opposite side (for example, on the right side) is much longer than in the case where the ASIC 12 is located at the center. In order to avoid such a long wiring distance, the wiring chips 13 are provided.

The wiring chips 13 are located adjacent to the ASIC 12. Input/output lines of the ASIC 12 are connected between the ASIC pads 18 and the wiring chip pads 19 of the wiring chip 13 adjacent to the ASIC 12. Where the wiring chips 13 have metal wires 20 in an L-shape, the wiring chip pads 19, located in a direction perpendicular to the wiring chip pads 19 connected to the ASIC pads 18, can be connected to the MCP pads 16 of the MCP substrate 10. By providing the wiring chips 13, it becomes easier to connect the ASIC pads 18 and the MCP pads 16 located in a direction perpendicular to the ASIC pads 18.

Regarding the L-shaped metal wires 20 of the wiring chips 13 shown in the example of FIG. 13, the metal wires 20 on an inner side and the metal wires 20 on an outer side have different lengths. Therefore, adjacent metal wires 20 have different wiring capacitances and different wiring resistances. Such a difference in the wiring capacitance and the wiring resistance between adjacent metal wires generates skew.

Figure 15:
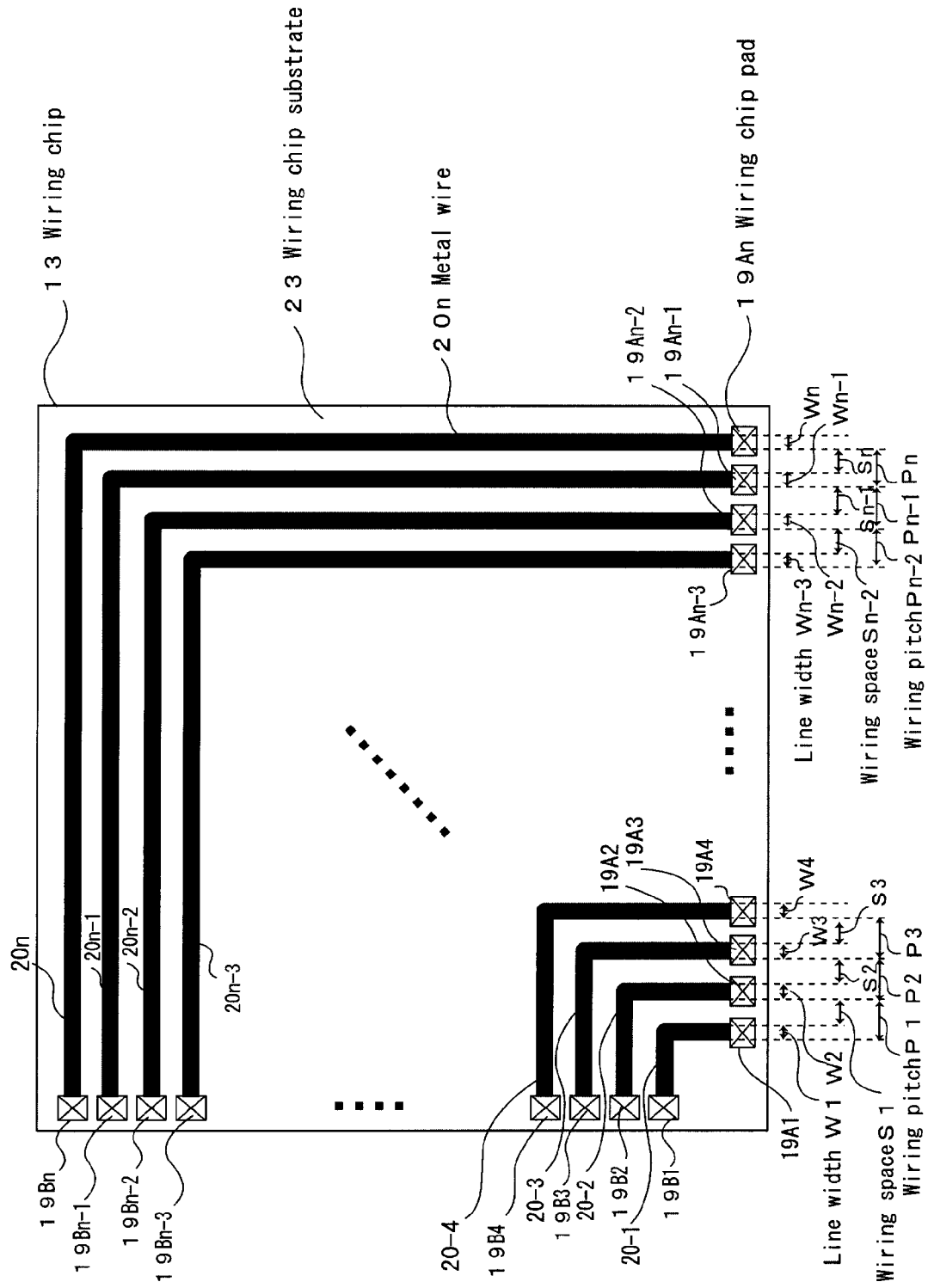
FIG. 15 is a plan view of a wiring pattern of a wiring chip.

The difference in the wiring capacitance and the wiring resistance between metal wires will be described in more detail with reference to FIG. 15. FIG. 15 is a plan view showing a wiring pattern of the wiring chip 13 used in an MCP. On a wiring chip substrate 23 of the wiring chip 13 shown in FIG. 15, wiring chip pads 19A1 through 19An are provided along one of four sides, and wiring chip pads 19B1 through 19Bn are provided along a side adjacent to the one side. The number of the wiring chip pads provided along the two adjacent sides is the same (n number of the wiring chip pads are provided). The wiring chip pads 19A1 through 19An and the wiring chip pads 19B1 through 19Bn are connected to each other by n-number of L-shaped metal wires 20-1 through 20n, respectively. The metal wires 20-1 on an inner side and the metal wires 20n on an outer side have approximately the same width, and each adjacent metal wires have approximately the same interval. Wiring pitches P1 through Pn are also approximately the same. For example, the wiring pitch P1 is the sum of the width of the metal wire 20-1 and the interval between the metal wire 20-1 and the metal wire 20-2 adjacent to the metal wire 20-1. The "inner side" refers to the side of a contact point of the two sides in the vicinity of the wiring chip pads 19A1 and 19B1, among the plurality of metal wires provided on the wiring chip 13, i.e., the side of the metal wire 20-1. The "outer side" refers to the opposite side to the inner side, among the plurality of metal wires provided on the wiring chip 13, i.e., the side of the metal wire 20n. In the following description, the width of one metal wire will be referred to as the "line width W", the width of the interval between one metal wire and a metal wire adjacent and outer to the one metal wire will be referred to as the "wiring space S", and the sum of the width of one metal wire and the interval between one metal wire and a metal wire adjacent and outer to the one metal wire will be referred to as the "wiring pitch P".

In the case where a plurality of metal wires are located with an equal line width W, an equal wiring space S, and an equal wiring pitch P on the wiring chip 13, the metal wire 20-1 on the inner side and the metal wire 20n on the outer side are significantly difference in the wiring length as shown in FIG. 15. As the length of a metal wire is longer, the capacitance between the metal wire and the substrate and the wiring capacitance between the metal wire and the adjacent metal wire increase. As the length of a metal wire is shorter, the capacitance between the metal wire and the substrate and the wiring capacitance between the metal wire and the adjacent metal wire decrease. As the line width W of the metal wire is wider, the capacitance per unit length between the metal line and the substrate increases. As the line width W of the metal wire is narrower, the capacitance per unit length between the metal wire and the substrate decreases. As the wiring space S of is larger, the wiring capacitance between two adjacent metal wires decreases. As the wiring space S of is smaller, the wiring capacitance between two adjacent metal wires increases. In FIG. 15, the metal wires are arranged at substantially the same line width W, substantially the same wiring space S and substantially the same wiring pitch P, and the metal wire 20-1 and the metal wire 20 are significantly different in the wiring length. Therefore, the wiring capacitance between the metal wire 20-1 and the metal wire adjacent thereto is significantly different from the wiring capacitance between the metal wire 20n and the metal wire adjacent thereto.

The above-mentioned wiring capacitance between adjacent metal wires appears as a capacitance of external pins of the MCP (in the example of FIG. 14, the bumps 14). Therefore, when the MCP is used, the external pins each have a large capacitance and the capacitance is different among the external pins. Such an MCP, in which the capacitances of the external pins are large and significantly different there among is used, prevents an increase in the signal processing speed and cannot easily reduce the power consumption. Such an MCP has a large skew (diversion in the timing of the signal input/output between the external pins), which reduces a margin of an operation speed or the like. In addition, recently, the number of memory chips mounted on one MCP is increased in compliance with a demand for a larger memory capacity. Accordingly, the number of memory chips connected to one external pin is increased. The input/output pin capacitances of each chip are added together. Therefore, it is required to minimize the difference in the wiring capacitance between adjacent metal wires in the entire chip.

Figure 2:
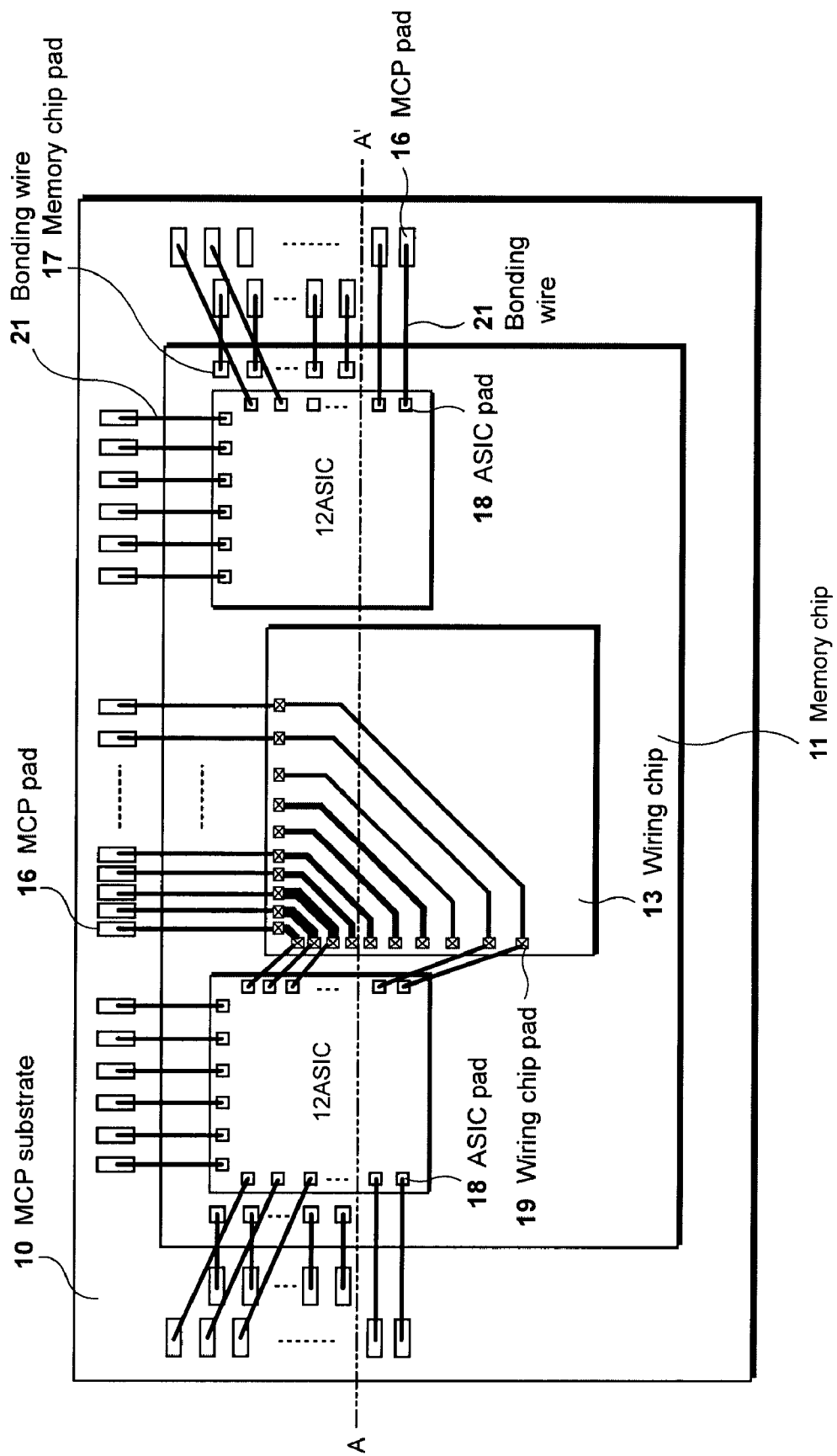
FIG. 2 is a plan view of the semiconductor device according to the first embodiment of the present invention.
Figure 3:
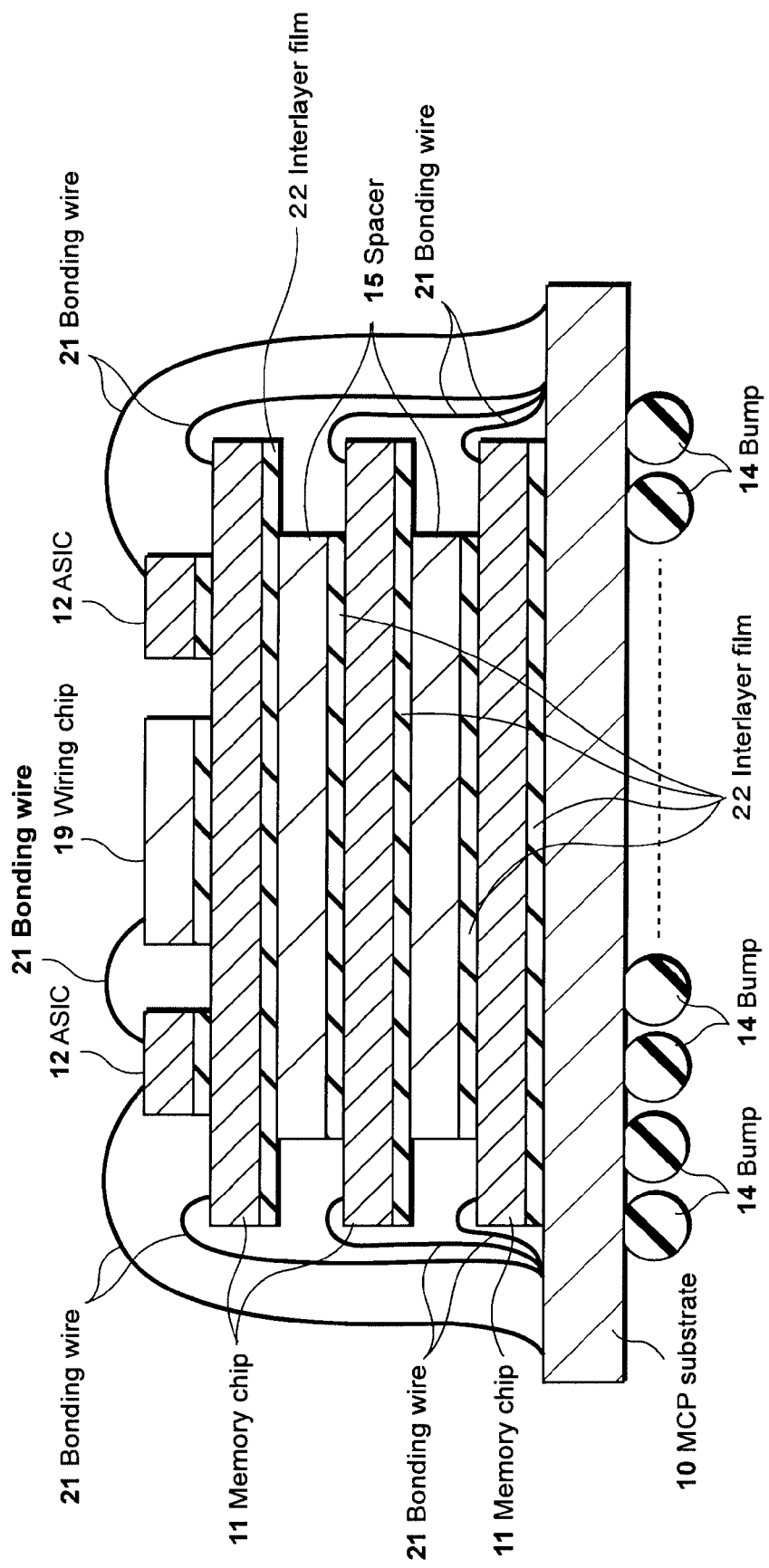
FIG. 3 is a cross-sectional view of the semiconductor device shown in FIG. 2 taken along line A-A'.

A semiconductor device according to the first embodiment of the present invention can minimize the difference in the wiring capacitance between adjacent wires. With reference to FIG. 1 through FIG. 3, a semiconductor device according to the first embodiment of the present invention will be described. FIG. 1 is a plan view showing a wiring pattern of a wiring chip of the semiconductor device according to the first embodiment of the present invention. FIG. 2 is a plan view of the semiconductor device according to the first embodiment of the present invention. FIG. 3 is a cross-sectional view of the semiconductor device shown in FIG. 2 taken along line A-A'.

In the semiconductor device according to the first embodiment, the length of each of the plurality of metal wires 20 for connecting wiring chip pads 19 on a wiring chip substrate 23 of a wiring chip 13 is made shorter than in the case where L-shaped metal wires are provided in the same size of wiring chip 13. In the semiconductor device according to the first embodiment, all the plurality of metal wires 20 in one chip do not have the same line width W. Instead, the line width W of each metal line is set to an arbitrary value (hereinafter, the line width set in this manner will be referred to as the "line width W adjustable at the time of designing" or "wiring width adjustable at the time of designing"). In the semiconductor device according to the first embodiment, all the wiring spaces S in one chip are not the same. Instead, each wiring space is set to an arbitrary value (hereinafter, the wiring space set in this manner will be referred to as the "wiring space S adjustable at the time of designing" or "wiring interval adjustable at the time of designing"). In the semiconductor device according to the first embodiment, all the wiring pitches P in one chip are not the same. Instead, each wiring pitch is set to an arbitrary value (hereinafter, the wiring pitch set in this manner will be referred to as the "wiring pitch P adjustable at the time of designing"). As a result, in the wiring chip 13 used in the semiconductor device according to the first embodiment, the wiring width of each metal wire 20, the wiring interval between each metal wire and a metal wire adjacent and outer thereto, and each wiring pitch as a sum of the wiring width and the wiring interval are set such that the difference in the wiring capacitance between each adjacent metal lines is minimum.

In the wiring chip 13 shown in FIG. 1, third pads (hereinafter, referred to as the "wiring chip pads") 19A1 through 19An are provided inside one of four sides, and wiring chip pads 19B1 through 19Bn are provided inside a side adjacent to the one side. The number of the wiring chip pads provided along the two adjacent sides is the same (n number of the wiring chip pads are provided). Each wiring chip pad 19Am and each wiring chip pad 19Bm are connected by a metal wire 20m (m=1 through n) in the wiring chip 13, sequentially from the wiring chip pads closest to a contact point on the two sides. Owing to the provision of the wiring chip 13, for example, data which is input to the wiring chip pad 19A1 is output from the wiring chip pad 19B1 via the metal wire 20-1. Data which is input to the wiring chip pad 19B1 is output from the wiring chip pad 19A1 via the metal wire 20-1. Namely, data passes through the wiring chip 13 and therefore is output in a direction perpendicular to the direction in which the data is input.

As shown in FIG. 1, the metal wires 20-1 through 20n for connecting the wiring chip pads 19A1 through 19An and the wiring chip pad 19B1 through 19Bn to each other have a trapezoidal shape with a base part removed (hereinafter, this shape will be referred to as the "trapezoid upper shape") in order to shorten the metal wires 20-1 through 20n. In order to connect the wiring chip pads 19A1 through 19An and the wiring chip pad 19B1 through 19Bn to each other with the relatively short length, the metal wires can be straight. However, when the number of the wiring chip pads 19A1 through 19An and the wiring chip pad 19B1 through 19Bn is increased to shorten the interval between adjacent wiring chip pads which are connected by straight the metal wires, the wiring spaces S1 through Sn between adjacent metal wires are also decreased. As a result, the difference in the wiring capacitance and the difference in the wiring resistance between adjacent metal wires are increased. For this reason, in the wiring chip 13 according to the first embodiment, the following structure is adopted in order to secure a certain wiring space S and also shorten the length of the metal wires. The plurality of metal wires 20 each include a first part drawn inward the wiring chip 13 from a first wiring chip pad 19A (or 19B) so as to be parallel to, or so as to form an acute angle with, the side along which a second wiring chip pad 19B (or 19A) is located, a second part drawn inward the wiring chip pad 13 from the second wiring chip pad 19B (or 19A) so as to be parallel to, or so as to form an acute angle with, the side along which the first wiring chip pad 19A (or 19B) is located, and a straight third part for connecting the first part and the second part to each other. Namely, the metal wires 20 have a trapezoid upper shape shown in FIG. 1. Where the metal wires 20 have such a shape, sufficient wiring spaces S can be guaranteed by adjusting the lengths of the first part and the second part between adjacent metal wires 20, and also the length of each metal wire 20 can be shortened as compared to the L-shaped metal wires 20 shown in FIG. 15.

FIG. 2 shows the semiconductor device according to the first embodiment. As shown in FIG. 2, memory chips 11 are mounted on an MCP substrate 10, and two ASICs 12 and a wiring chip 13 are mounted on the top memory chip 11. First wiring chip pads 16 provided in the MCP substrate 10 and connected to connection electrodes of the MCP (hereinafter, the first wiring chip pads will be referred to as the "MCP pads") and memory chip pads 17 provided on a substrate of each memory chip 11 are connected to each other by bonding wires 21. Similarly, second pads 18 provided on a substrate of each ASIC 12 (hereinafter, the second pads 18 will be referred to as the "ASIC pads 18") and the MCP pads 16 are connected to each other by bonding wires 21. A part of the ASIC pads 18 of the ASIC 12 which is shown left in FIG. 2 and a part of the wiring chip pads 19 of the wiring chip 13 are connected to each other. With such connections, the ASIC pads 18 of the ASIC 12 shown left in FIG. 12, which are not directly connected to the MCP pads 16, are electrically connected to the MCP pads 16 via the wiring chip 13.

FIG. 3 is a cross-sectional view of the semiconductor device shown in FIG. 2 taken along line A-A'. As shown in FIG. 3, the memory chips 11 are stacked on the MCP substrate 10 with interlayer films 22 and spacers 15 being interposed therebetween. The MCP substrate 10 may be formed of silicon, glass or the like. In the example of FIG. 3, three memory chips 11 are stacked, but the number of memory chips 11 is not limited to three. On the top memory chip 11, two ASICs 12 and a wiring chip 13 are mounted. On a bottom surface of the MCP substrate 10, bumps 14 for directly connecting electrodes are provided. The memory chip pads (not shown in FIG. 3) of each memory chip 11 and the MCP pads (not shown in FIG. 3) of the MCP substrate 10 are connected to each other by the bonding wires 21, and the ASIC pads (not shown in FIG. 3) of each of the two ASICs 12 and the MCP pads (not shown in FIG. 3) of the MCP substrate 10 are connected to each other by the bonding wires 21.

The ASIC 12 shown left in FIG. 3 and the wiring chip 13 are connected to each other by the bonding wires 21. With the provision of the wiring chip 13, each bonding wire 21 can be shorter. In the example of FIG. 2 and FIG. 3, only the ASIC 12 shown left is connected to the MCP pads 16 of the MCP substrate 10 by the wiring chip 13. By locating the wiring chip 13 at an appropriate position in accordance with the purpose, the ASIC pads of the ASIC 12 shown right and left can be connected to the MCP pads 16.

With the provision of the wiring chip 13, the bonding wires 21 for connecting each ASIC 12 and the wiring chip 13 can be shortened, and wires for connecting the wiring chip 13 and the MCP pads 16 can also be shortened. In addition, the metal wires 20 for connecting the wiring chip pads in the wiring chip are of the relatively short possible length owing to the trapezoid upper shape. Therefore, the total wiring length from the ASIC 12 to the MCP pads 16 of the MCP substrate 10 can also be shortened. As the number of memory chips 11 stacked on the MCP substrate 10 is increased, the number of wires increases, and the number of ASICs may be increased. This extends the length of bonging wires 21 for connecting the chips (including ASICs), which makes the wiring difficult. However, the semiconductor device according to the first embodiment of the present invention suppresses the length of the bonding wires 21 from being extended owing to the provision of the wiring chip 13. This is also applicable even when the number of memory chips 11 stacked on the MCP substrate 10 is significantly increased or when the number of ASICs 12 mounted on the MCP is significantly increased.

In the first embodiment of the present invention, the metal wires 20 have the line width W adjustable at the time of designing. As shown in FIG. 1, the innermost metal wire 20-1 which is relatively short and having a relatively small wiring capacitance with the adjacent metal wire 20-2 has a relatively wide line width W. The outermost metal wire 20$n$ which is relatively long and having a relatively large wiring capacitance with the adjacent metal wire 20$n$-1 has a relatively narrow line width W. The line width W of the metal wire 20 is set to be narrower as being closer to the outermost metal wire 20$n$. By adjusting the line width W of each metal wire 20 in this manner, the wiring capacitance between the relatively short adjacent metal wire 20-1 and the adjacent metal wire 20-2 can be increased whereas the wiring capacitance between the relatively long metal wire 20$n$ and the adjacent metal wire 20$n$-1 can be decreased.

In the first embodiment of the present invention, the metal wires 20 are arranged with a wiring space S adjustable at the time of designing. As shown in FIG. 1, the wiring spaces S between the plurality of metal wires 20-1 through 20$n$ are not equal, but the wiring space S is set to be wider as being closer to the outermost wiring space Sn from the innermost wiring space S1. By adjusting the wiring spaces S1 through Sn in this manner, the wiring capacitance between the metal wire 20-1 and the adjacent metal wire 20-2 can be increased whereas the wiring capacitance between the metal wire 20$n$ and the adjacent metal wires 20$n$-1 can be decreased.

In the first embodiment of the present invention, the metal wires 20 are arranged with a wiring pitch P adjustable at the time of designing. As shown in FIG. 1, the wiring pitches P, each of which is the sum of the line width W of the metal wire 20 and the wiring space S between the metal wire 20 and the metal wire adjacent and outer thereto, are not equal. The wiring pitch P is set to be wider as being closer to the outermost pitch Pn from the innermost pitch P1.

As described above, the wiring chip 13 of the semiconductor device according to the first embodiment includes the metal wires 20-1 through 20$n$ which have a trapezoid upper shape and are arranged with the line width W adjustable at the time of designing, the wiring space S adjustable at the time of designing and the wiring pitch P adjustable at the time of designing. Owing to such a structure, the innermost and relatively short metal wire 20-1 is arranged with a relatively wide line width W1 and a relatively narrow wiring space S1 with the adjacent metal wire 20-2. Therefore, the capacitance per unit length between the metal wire 20-1 and the wiring chip substrate 23 can be maximized, and the capacitance between the metal wire 20-1 and the adjacent metal wire 20-2 can also be maximized. The outermost and relatively long metal wire 20$n$ is arranged with a relatively narrow line width Wn and a relatively wide wiring space Sn with the adjacent metal wire 20$n$-1. Therefore, the capacitance per unit length between the metal wire 20$n$ and the wiring chip substrate 23 can be minimized, and the capacitance between the metal wire 20$n$ and the adjacent metal wire 20$n$-1 can also be minimized. As a result, the wiring capacitance regarding the innermost metal wire 20-1 is relatively increased, and the wiring capacitance regarding the outermost metal wire 20$n$ is relatively decreased. Therefore, the difference in the wiring capacitance between the plurality of metal wires 20 in the entire wiring chip 13 can be minimized.

Figure 4:
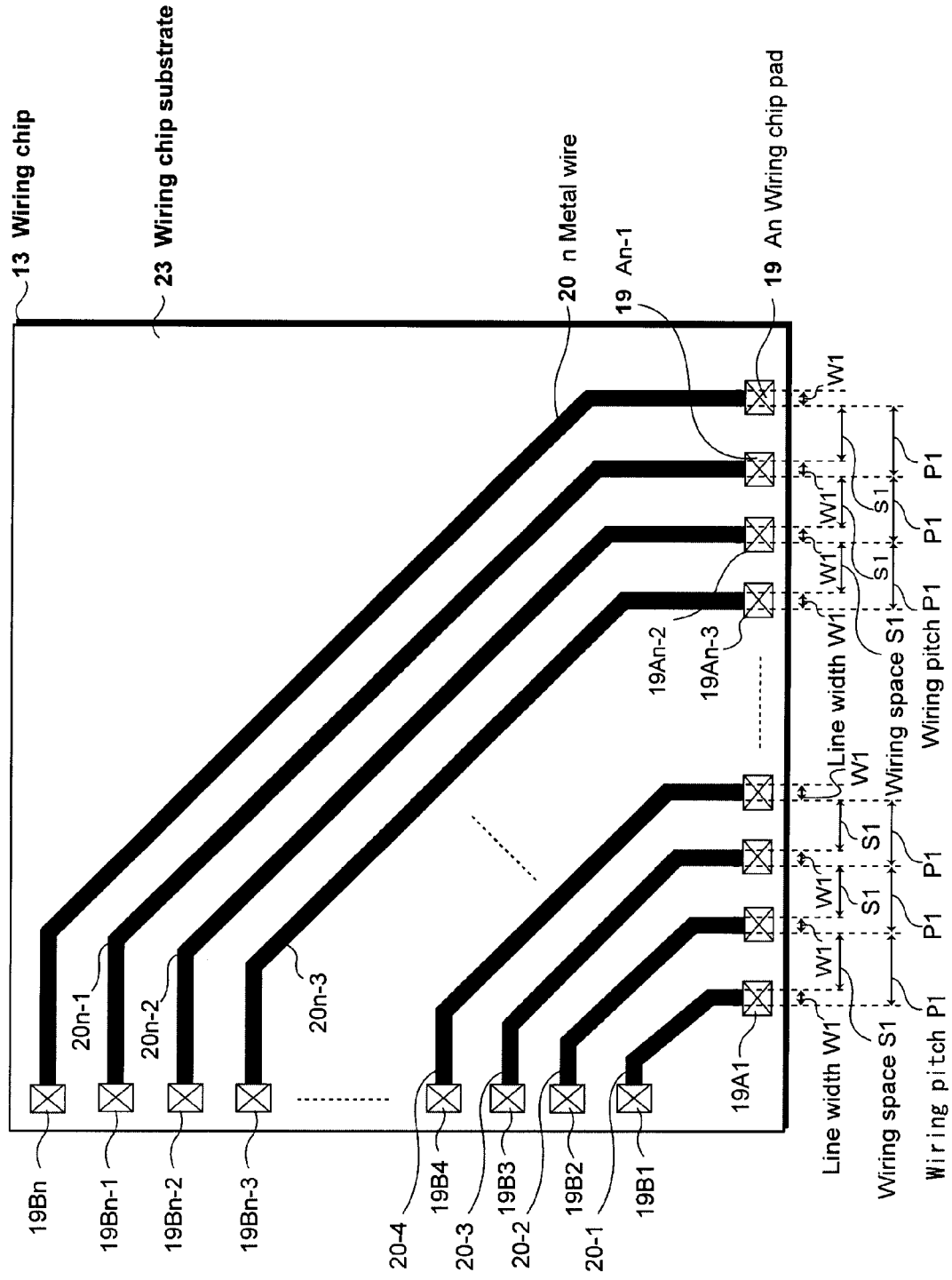
FIG. 4 is a plan view of a wiring pattern of a wiring chip according to the first embodiment of the present invention, which adopts an equal line width, an equal wiring space, and an equal wiring pitch.

In the example of FIG. 1, the metal wires 20 have a trapezoid upper shape and are arranged with the line width W adjustable at the time of designing, the wiring space S adjustable at the time of designing and the wiring pitch P adjustable at the time of designing. The wiring chip of the semiconductor device according to the first embodiment of the present invention may combine the line width W adjustable at the time of designing, the wiring space S adjustable at the time of designing and the wiring pitch P adjustable at the time of designing in any way. For example, in order to arrange the wiring chip pads 19A1 through 19An and 19B1 through 19Bn at an equal interval, it is possible to set the line widths W1 through Wn and the wiring spaces S1 through Sn to be adjustable at the time of designing whereas to set the wiring pitch P to be equal, i.e., to set all the wiring pitches to the wiring pitch P1. In this case, although not shown, in order to reduce the difference in the wiring capacitance between adjacent metal wires 20 in the entire wiring chip 13, the line width W1 of the innermost and relatively short metal wire 20-1 is set to be relatively wide, and the wiring space S1 is set to be relatively narrow. The line width W is set to be narrower as being closer to the outermost line width Wn, whereas the wiring space S is set to be wider as being closer to the outermost wiring space Sn. Alternatively, as shown in FIG. 4, it is possible to arrange the metal wires 20 with an equal line width W, an equal wiring space S, and an equal wiring pitch P. Namely, it is possible to set all the line widths W to the line width W1, to set all the wiring spaces S to the wiring space S1, and to set all the wiring pitches P to the wiring pitch P1, as in the conventional wiring chip. Although not shown, even in an MCP including a wiring chip in which each of all the parameters W, S and P adjustable at the time of designing is set to equal, it is possible to suppress the length of the bonding wires 21 from being extended like in FIG. 2. This is applicable even when the number of memory chips 11 stacked on the MCP substrate 10 is significantly increased or when the number of ASICs 12 mounted on the MCP is significantly increased. In accordance with the number of wires and the size of the wiring chip 13, the line width W adjustable at the time of designing, the wiring space S adjustable at the time of designing and the wiring pitch P adjustable at the time of designing can be combined in any way with the wires having a trapezoid upper shape. Thus, the difference in the wiring capacitance between adjacent metal wires can be decreased in the entire wiring chip.

Second Embodiment

According to a second embodiment of the present invention, the CR delay generated in each of a plurality of metal wires 20 located in a wiring chip can be minimized, and the difference in the CR delay among the plurality of metal wires 20 can be minimized. This can contribute to an increased signal transmission speed in the MCP. This will be described with reference to the drawings.

Figure 5:
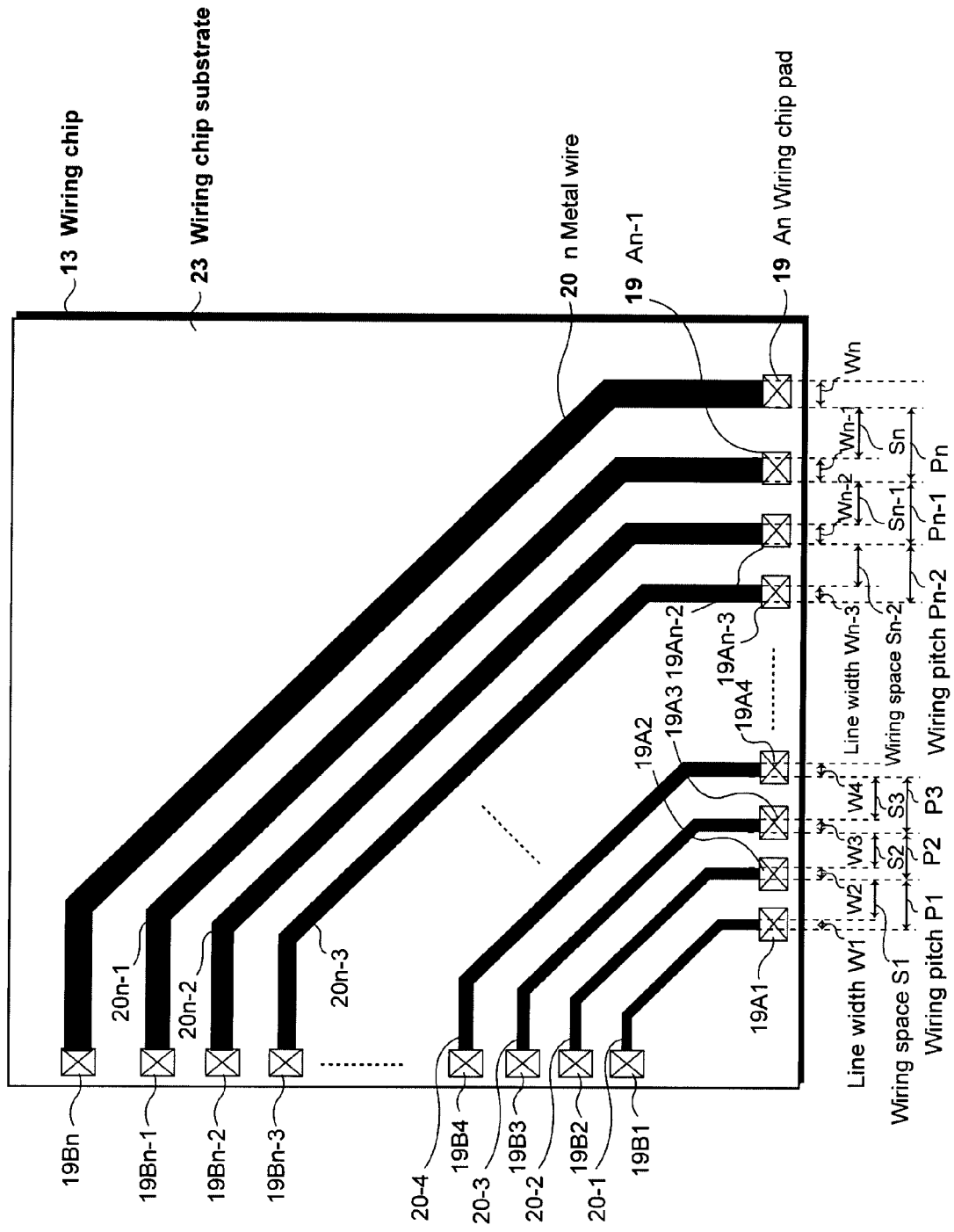
FIG. 5 is a plan view of a wiring pattern of a wiring chip of a semiconductor device according to a second embodiment of the present invention.

FIG. 5 is a plan view showing a wiring pattern of a wiring chip 13 of a semiconductor device according to the second embodiment of the present invention. As shown in FIG. 5, the wiring chip 13 of the semiconductor device according to the second embodiment of the present invention includes wiring chip pads 19A1 through 19An provided inside one of four sides thereof, and wiring chip pads 19B1 through 19Bn provided inside a side adjacent to the one side. The number of the wiring chip pads provided along the two adjacent sides is the same (n number of the wiring chip pads are provided). The wiring chip pads 19A1 through 19An and the wiring chip pads 19B1 through 19Bn are connected to each other by metal wires 20-1 through 20n respectively, sequentially from the wiring chip pads closest to a contact point on the two sides.

The wiring chip pads 19 are located such that the wiring space S is increased as being closer to the outermost wiring space Sn from the innermost wiring space S1, i.e., as being closer to the wiring chip pads 19An and 19Bn from the wiring chip pads 19A1 and 19B1. The line width W of the metal wire 20 is set to be increased as being closer to the line width Wn from the innermost line width W1. The wiring pitch P is also set to be increased as being closer to the outermost wiring pitch Pn from the innermost wiring pitch P1.

In the wiring chip 13 of the semiconductor device according to the second embodiment, the outermost and relatively long metal wire 20n is arranged with a relatively wide line width Wn and a relatively wide wiring space Sn with the adjacent metal wire 20n−1, and as a result, with a relatively wide wiring pitch Pn. By contrast, the innermost and relatively short metal wire 20-1 is arranged with a relatively narrow line width W1 and a relatively narrow wiring space S1 with the adjacent metal wire 20-2, and as a result, with a relatively narrow wiring pitch P1. In a consequence, the wiring capacitance between the outermost and relatively long metal wire 20n and the adjacent metal wire 20n−1 is relatively decreased as compared to the wiring capacitance between the innermost and relatively short metal wire 20-1 and the adjacent metal wire 20-2. Therefore, the wiring resistance of the metal wire 20n can be decreased.

Namely, the outermost metal wire 20n is relatively long and therefore has a relatively large wiring capacitance with the adjacent metal wire 20n−1. The metal wire 20n also has a relatively wide line width Wn, and therefore the capacitance per unit length between the metal wire 20n and a wiring chip substrate 23 is also relatively large. As a result, the wiring resistance of the metal wire 20n is relatively large. However, because the wiring pitch Pn regarding the metal wire 20n is wider than the wiring pitch P1 regarding the metal wire 20-1, the wiring capacitance between the metal wire 20n and the adjacent metal wire 20n−1 is decreased, which also decreases the wiring resistance. Thus, the effects provided by the line width W, the wiring space Sn, and the wiring pitch Pn are mutually counteracted. As a result, the wiring resistance of the metal wire 20n can be suppressed to be a certain appropriate level, and the CR delay can also be suppressed to be a certain appropriate level.

The CR delay is determined based on the relationship of the length of each metal wire, the line width W and the wiring pitch P. Therefore, the CR delay can be adjusted by appropriately combining the line width W adjustable at the time of designing, the wiring space S adjustable at the time of designing and the wiring pitch P adjustable at the time of designing.

As described above, in the wiring chip 13 according to the second embodiment, the line width W and the wiring space S regarding the outermost metal wire 20n are made wider than those regarding the innermost metal wire 20-1, and hence the wiring capacitance between the metal wire 20n and the adjacent metal wire 20n−1 and also the wiring resistance of the metal wire 20n can be decreased. As a result, the largest CR delay generated in the metal wire 20n can be effectively decreased, and also the difference between the CR delay generated in the metal wire 20n and the CR delay generated in the adjacent metal wire 20n−1 can be effectively decreased. This can increase the signal transmission speed. The decreasing degree of the CR delay can be adjusted to a desired level by appropriately adjusting parameters such as, for example, the capacitance between each metal wire 20 and the wiring chip substrate 23, the wiring capacitance between each adjacent metal wires 20, and the specific resistance of each metal wire 20. In this case, the line width W and the wiring space S are changeable, and the line width W or the wiring space S may be set to be equal depending on the number of metal wires located in the wiring chip 13, the chip size of the wiring chip 13, or the like. Although not shown, by mounting the wiring chip 13 according to the second embodiment on a semiconductor, the length of the bonding wires 21 can be suppressed from being extended like in FIG. 2. This is applicable even when the number of memory chips 11 stacked on the MCP substrate 10 is significantly increased or when the number of ASICs 12 mounted on the MCP is significantly increased.

Third Embodiment

While the memory capacity of semiconductor memories increases and the number of the semiconductor memories, ASICs, or the like mounted on MCPs increases, the size of the MCPs themselves is more and more decreased in response to the demand to reduce the mounting area. In such a situation, it is required to reduce the wiring pitch P of the wiring chip to increase the number of wires per chip in order to allow the number of connection wires to be increased while reducing the chip size as demanded. According to a third embodiment of the present invention, the number of wires can be increased while narrowing the wiring pitch P.

Figure 6:
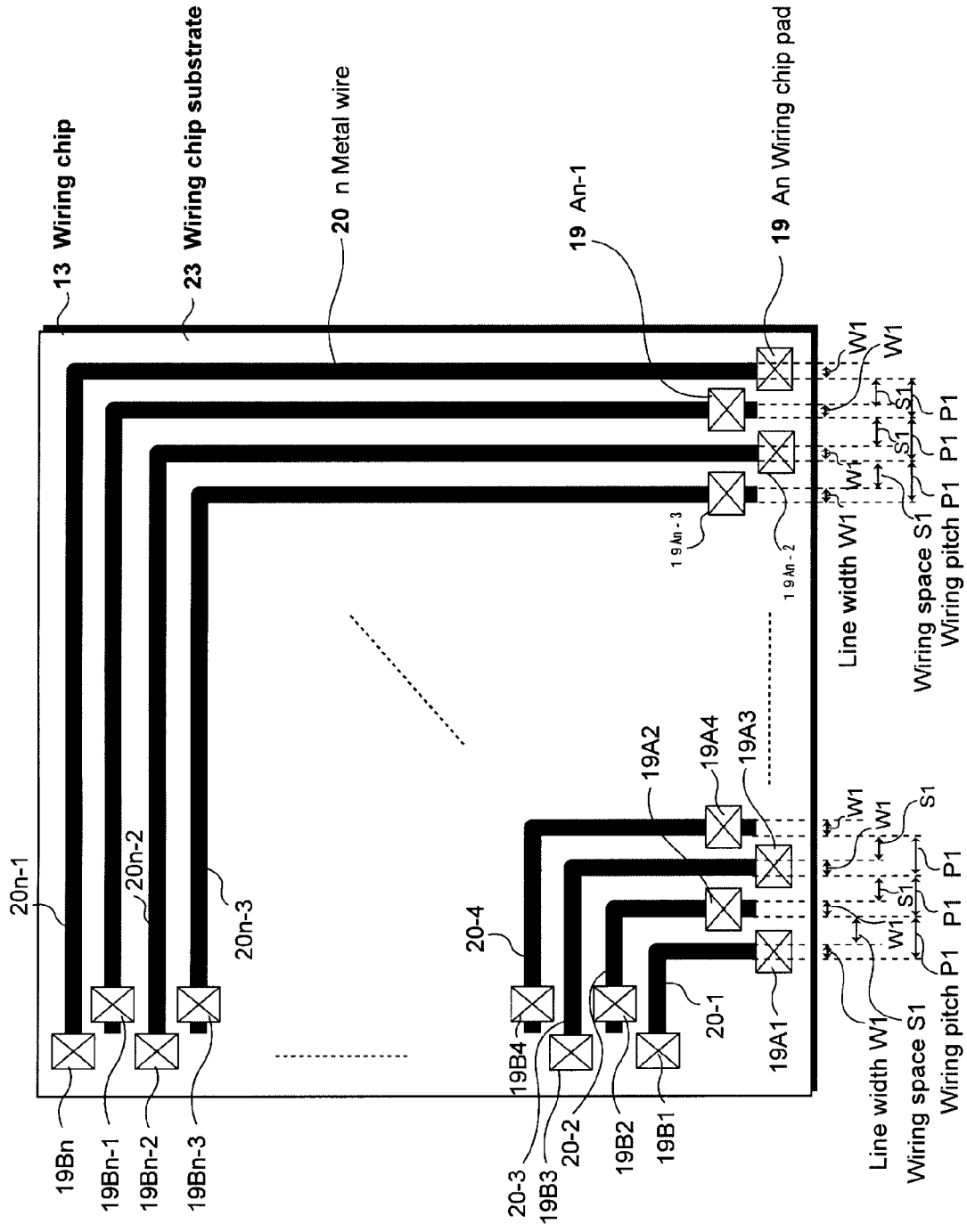
FIG. 6 is a plan view of a wiring pattern of a wiring chip of a semiconductor device according to a third embodiment of the present invention.

FIG. 6 is a plan view of a wiring pattern of a wiring chip of a semiconductor device according to the third embodiment of the present invention. In the third embodiment of the present invention, the wiring chip pads are located inside two adjacent side of four sides of the wiring chip with an equal number. Along each side, the wiring chip pads are located alternately in a plurality of lines, and arranged such that two or more pads are not aligned in a direction perpendicular to the respective side.

With reference to FIG. 6, the wiring pattern of the wiring chip of the semiconductor device according to the third embodiment will be described. As shown in FIG. 6, on a wiring chip substrate 23 of the wiring chip 13, a plurality of wiring chip pads 19A and a plurality of wiring chip pads 19B provided for connecting the wiring chip 13 to the ASIC and the MCP substrate are located along the two sides in a plurality of lines (two lines in this example) as described above. Along one of the two sides, even numbered wiring chip pads 19A2 through 19An−1 are located in an inner line of the two lines, and odd numbered 19A1 through 19An are located in an outer line. The odd numbered wiring chip pads 19A1 through 19An, and the even numbered wiring chip pads 19A2 through 19An−1, are located alternately such that two or more wiring chip pads are not aligned in a direction perpendicular to the side. In other words, the wiring chip pads 19A1, 19A2 through 19An are arranged zigzag. Along the other side, the wiring chip pads 19B1, 19B2 through 19Bn are arranged in the same manner. In the example of FIG. 6, the wiring chip pads 19A1, 19A2 through 19An are located in two lines, and the wiring chip pads 19B1, 19B2 through 19Bn are located in two lines. The number of lines is not limited to any specific number as long as there is no problem in the wiring of metal wires 20-1 through 20n.

The wiring chip pads 19A1, 19A2 through 19An and 19B1, 19B2 through 19Bn located in two lines are connected to each other by the L-shaped metal wires 20-1 through 20n respectively, sequentially from the wiring chip pads closest to a contact point on the two sides. The metal wires 20-1 through 20n are all arranged with an equal line width W1, an equal wiring space S1 and an equal wiring pitch P1.

By locating the wiring chip pads alternately such that two or more wiring chip pads are not aligned in a direction perpendicular to the respective side, the number of the wiring chip pads 19 mountable on the wiring chip 13 can be increased without enlarging the size of the wiring chip 13. This fulfills well the demand for an increased number of wires. In a structure where the wiring chip pads 19 are located in one line, adjacent wiring chip pads 19 need to be located with a certain interval (the length of the longer side of the wiring chip pad 19+$\alpha$) therebetween. By contrast, in a structure where the wiring chip pads 19 are located in a plurality of lines, even where the wiring chip pads 19 are partially overlapped in a direction perpendicular to the respective side, there is a sufficient interval between adjacent wiring chip pads 19 in each line. Therefore, the wiring chip pads 19 can be located with an interval with which the metal wires 20 are not overlapped and shortcircuiting, leak or the like is not caused between adjacent metal lines 20. As a result, the wiring pitch P can be narrowed, which allows the number of wires to be increased in the same size of wiring chip.

By locating the wiring chip pads alternately such that two or more wiring chip pads are not aligned in a direction perpendicular to the respective side, a part of the metal lines 20 can be shortened. This can suppress the wiring capacitance between adjacent metal lines.

In FIG. 6, the metal lines 20-2 through 20-n for connecting the wiring chip pads 19A2 through 19An-1 and 19B2 through 19Bn-1 located in the inner lines, even though being located outer to the metal lines 20-1 through 20n for connecting the wiring chip pads 19A1 through 19An and 19B1 through 19Bn located in the outer lines, are not necessarily longer. The wiring chip pads 19A2 through 19An-1 and 19B2 through 19Bn-1 are located inner to the wiring chip pads 19A1 through 19An and 19B1 through 19Bn. Therefore, where the number of the metal wires 20 is the same, a part of the metal wires 20 can be shortened as compared to the metal wires 20 in the case where the wiring chip pads 19 are located in one line, as more specifically described below.

The wiring chip pads 19A2 through 19An-1 and 19B2 through 19Bn-1 located in the inner line are provided inner to the wiring chip pads 19A1 through 19An and 19B1 through 19B, by the sum of the length of the shorter side of the inner wiring chip pads 19A2 through 19An-1 and 19B2 through 19Bn-1 and the interval between the inner wiring chip pads 19A2 through 19An-1 and 19B2 through 19Bn-1 and the outer wiring chip pads 19A1 through 19An and 19B1 through 19B. Therefore, the length of the metal wires 20-2 through 20n-1 can be shorter than the metal wires 20-1 through 20n by the total of the above sums on the two sides. For this reason, the wiring capacitance, which is increased as the length of the metal wire 20 is increased, can be suppressed.

In the semiconductor device according to the third embodiment of the present invention, the number of wires can be increased while narrowing the wiring pitch P owing to the wiring pattern of the wiring chip. This fulfills well the demand for a reduced size of semiconductor device itself. Although not shown, in an MCP including the wiring chip 13 according to the third embodiment also, the length of the bonding wires 21 can be suppressed from being extended like in FIG. 2. This is applicable even when the number of memory chips 11 stacked on the MCP substrate 10 is significantly increased or when the number of ASICs 12 mounted on the MCP is significantly increased.

Fourth Embodiment

In the third embodiment of the present invention, it is indicated that the number of wires can be increased while reducing the size of the wiring chip and also that the wiring capacitance between adjacent wires can be suppressed regarding a part of the wires. By combining the wiring chip described above in the third embodiment with the trapezoid upper shape of the metal wires 20, the line width W adjustable at the time of designing, the wiring space S adjustable at the time of designing and the wiring pitch P adjustable at the time of designing, the wiring capacitance between adjacent wires can be suppressed more effectively while allowing the number of wires to be increased. In a wiring pattern of a wiring chip according to a fourth embodiment of the present invention, the wiring chip pads are located alternately in a plurality of lines such that two or more pads are not aligned in a direction perpendicular to the respective side, and the wiring chip pads are connected in the wiring chip by metal wires which have a trapezoid upper shape and are arranged with the line width W adjustable at the time of designing, the wiring space S adjustable at the time of designing and the wiring pitch P adjustable at the time of designing.

Figure 7:
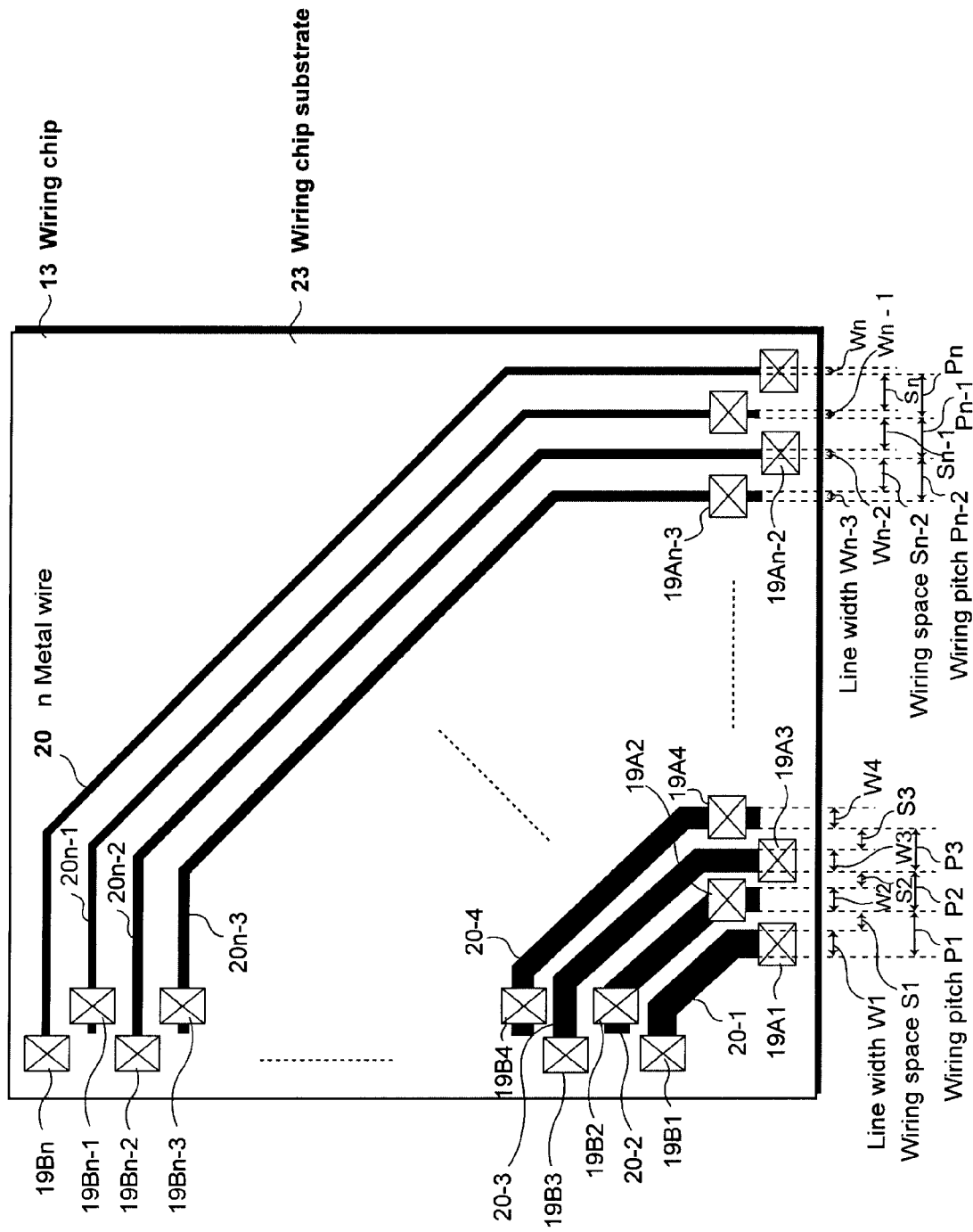
FIG. 7 is a plan view of a wiring pattern of a wiring chip of a semiconductor device according to a fourth embodiment of the present invention.

FIG. 7 is a plan view of a wiring pattern of a wiring chip of a semiconductor device according to the fourth embodiment of the present invention. In the fourth embodiment, the wiring chip pads are located along two adjacent side of four sides of the wiring chip with an equal number. Along each side, the wiring chip pads are located alternately in a plurality of lines, and arranged such that two or more pads are not aligned in a direction perpendicular to the respective side. The metal wires for connecting the wiring chip pads have a trapezoid upper shape and are arranged with the line width W adjustable at the time of designing, the wiring space S adjustable at the time of designing and the wiring pitch P adjustable at the time of designing.

With reference to FIG. 7, the wiring pattern of the wiring chip of the semiconductor device according to the fourth embodiment will be described. As shown in FIG. 7, on a wiring chip substrate 23 of the wiring chip 13, a plurality of wiring chip pads 19 for connecting the wiring chip 13 to the external. ASIC and the MCP substrate are located along the two sides in two lines. As described above, the wiring chip pads 19A1 through 19An and the wiring chip pads 19A2 through 19An-1 are located alternately in two lines such that two or more wiring chip pads are not aligned in a direction perpendicular to the side along which these wiring chips are located. The wiring chip pads 19B1 through 19Bn and the wiring chip pads 19B2 through 19Bn-1 are located alternately in two lines such that two or more wiring chip pads are not aligned in a direction perpendicular to the side along which these wiring chips are located. In the example of FIG. 7, the wiring chip pads are located in two lines along each side, but the number of lines is not limited to any specific number as long as there is no problem in the wiring of metal wires 20-1 through 20n.

Owing to such a structure, a greater number of wiring chip pads 19 can be located than in the conventional art, and thus the number of wires can be increased. In a structure where the wiring chip pads 19 are located in one line, adjacent wiring chip pads 19 need to be located with a certain interval (the length of the longer side of the wiring chip pad 19+α) therebetween. By contrast, in a structure where the wiring chip pads 19 are located in a plurality of lines, even where the wiring chip pads 19 are partially overlapped in a direction perpendicular to the respective side, there is a sufficient interval between adjacent wiring chip pads 19 in each line. Therefore, the wiring chip pads 19 can be located with an interval with which the metal wires 20 are not overlapped and short-circuiting, leak or the like is not caused between adjacent metal lines 20. In each line, the interval between adjacent wiring chip pads 19 can be narrower than the length of the longer side of the wiring chip pads (in the case where the wiring chip pads are square, the length of each side thereof). As a result, a greater number of the wiring chip pads 19 can be located. This effect is the same as that of the third embodiment.

The wiring chip pads 19A1 through 19An and 19A2 through 19n−1 and wiring chip pads 19B1 through 19Bn and 19B2 through 19Bn−1 are connected to each other respectively by the metal wires 20-1 through 20n having a trapezoid upper shape, sequentially from the wiring chip pads closest to a contact point on the two sides. Owing to the provision of the wiring chip 13, the input/output of the MCP can be input/output in a direction perpendicular to the input/output direction of the ASICs or the memory chips. In the fourth embodiment, the wiring chip pads are located alternately in two lines, such that two or more wiring chip pads are not aligned in a direction perpendicular to the respective side. Owing to this, a desired number of wires can be located in the wiring chip 13 even when the size of the wiring chip 13 is reduced.

Only with the wiring chip pads located alternately in two lines as described above, it is not easy to effectively decrease the difference in the wiring capacitance and the difference in the wiring resistance between adjacent wires caused by the difference in the length of the wires, although the size of the wiring chip can be reduced. The reason is that as the size of the wiring chip is smaller, the influence of the difference in the wiring capacitance and the difference in the wiring resistance between adjacent wires caused by the difference in the length of the wires is increased.

This will be described specifically. In a structure where wiring chip pads 19 located alternately in two lines are connected by L-shaped metal lines 20, the inner metal wires 20 and the outer metal wires 20 have significantly different lengths. As a result, the difference in the wiring capacitance and the difference in the wiring resistance between adjacent metal wires 20 caused by the different lengths of the metal wires 20 are conspicuous. Unlike in a structure where wiring chip pads 19 are located in one line and thus adjacent wiring chip pads 19 need to be located with a certain interval (the length of the longer side of the wiring chip pad 19+α) therebetween, in a structure where the wiring chip pads 19 are located alternately in a plurality of lines, there is a sufficient interval between adjacent wiring chip pads 19 in each line. As described above, in each line, the interval between adjacent wiring chip pads 19 can be narrower than the length of the longer side of the wiring chip pads 19 (in the case where the wiring chip pads 19 are square, the length of each side thereof). This necessarily narrows the wiring space S between adjacent metal wires 20. Therefore, the influence of the difference in the wiring capacitance between adjacent metal wires 20 is increased.

In the fourth embodiment of the present invention, the metal wires 20 in the wiring chip 13 have a trapezoid upper shape and are arranged with the line width W adjustable at the time of designing, the wiring space S adjustable at the time of designing and the wiring pitch P adjustable at the time of designing. Owing to such a structure, the difference in the wiring capacitance and the difference in the wiring resistance between adjacent metal wires 20 caused by the different lengths of the metal wires 20 can be decreased. As shown in FIG. 7, the metal wires 20-1 through 20n having a trapezoid upper shape can be shorter than the L-shaped metal wires. This effect provided by the wiring chip is the same as that in the first embodiment and the second embodiment.

The line widths W1 through Wn of the metal wires 20-1 through 20n are set such that the line width W1 of the innermost metal wire 20-1 is relatively wide, and the line width W is set to be decreased as being closer to the line width Wn of the outermost metal wire 20n. Therefore, in the fourth embodiment, the capacitance between adjacent metal wires which is decreased as the metal wire is shorter, and the capacitance per unit length between the metal wire and the wiring chip substrate 23 which is increased as the line width W of the metal wire is wider, can be adjusted in accordance with the length of the metal wire. Namely, an inner and shorter metal wire 20 can be set to have a larger wiring capacitance with the adjacent metal wire and also to have a larger capacitance per unit length with the wiring chip substrate 23. An outer and longer metal wire 20 can be set to have a smaller wiring capacitance with the adjacent metal wire and also to have a smaller capacitance per unit length with the wiring chip substrate 23.

In the semiconductor device according to the fourth embodiment of the present invention, the innermost metal wire 20-1 of the wiring chip 13 is set to have a relatively narrow wiring space S1. The wiring space S is set to be gradually increased as being closer to the outermost wiring space Sn. As a result of mutual effects of the wiring space S set in this manner and the line width W which is set to be increased as being closer to the innermost metal wire 20-1, the wiring pitch P is decreased as being closer to the innermost wiring pitch P1 and is increased as being closer to the outermost wiring pitch Pn. Since the innermost metal wire 20-1 has a relatively wide line width W1 and a relatively narrow wiring space S1, the capacitance per unit length between the metal wire 20-1 and the wiring chip substrate 23 is increased and the influence of the capacitance between the metal wire 20-1 and the adjacent metal wire 20-2 is also increased. However, the innermost metal wire 20-1 is relatively short and the capacitance between the metal wire 20-1 and the adjacent metal wire 20-2 is relatively small. As a result, the capacitance between these adjacent metal wires can be suppressed. The outermost metal wire 20n is relatively long and thus the capacitance between the metal wire 20n and the adjacent metal wire 20n−1 is relatively large. However, the outermost metal wire 20n has a relatively narrow line width Wn and a relative narrow wiring space Sn. Therefore, the capacitance per unit length between the metal wire 20n and the wiring chip substrate 23 is decreased, and thus the influence of the capacitance between the metal wire 20n and the metal wire 20n−1 is relatively small. As a result, the capacitance between these adjacent metal wires can be suppressed.

Owing to the above-described effects, the wiring pattern of the wiring chip 13 of the semiconductor device according to the fourth embodiment of the present invention can effectively decrease the difference in the wiring capacitance and the difference in the wiring resistance between adjacent wires caused by the difference in the length of the wires. In addition, since the number of wires can be increased, a semiconductor having a reduced mounting area can be provided. Although not shown, in an MCP including the wiring chip 13 according to the fourth embodiment also, the length of the bonding wires 21 can be suppressed from being extended like in FIG. 2. This is applicable even when the number of memory chips 11 stacked on the MCP substrate 10 is significantly increased or when the number of ASICs 12 mounted on the MCP is significantly increased.

Fifth Embodiment

While the number of semiconductor memories, ASICs, or the like mounted on MCPs increases, the size of the MCPs themselves is more and more decreased in response to the demand to reduce the mounting area. When the size of the MCPs is more decreased and accordingly the number of semiconductor memories or ASICs mounted on MCPs increases in the future, it is expected that wide wires such as a power supply wire or the like need to be connected using a wiring chip. In such a case, it is effective to arrange the metal wires having a trapezoid upper shape with the line width W adjustable at the time of designing, the wiring space S adjustable at the time of designing and the wiring pitch P adjustable at the time of designing. In a semiconductor device according to a fifth embodiment, the wiring pattern of the wiring chip is applicable to wide wires such as a power supply wire or the like.

Figure 8:
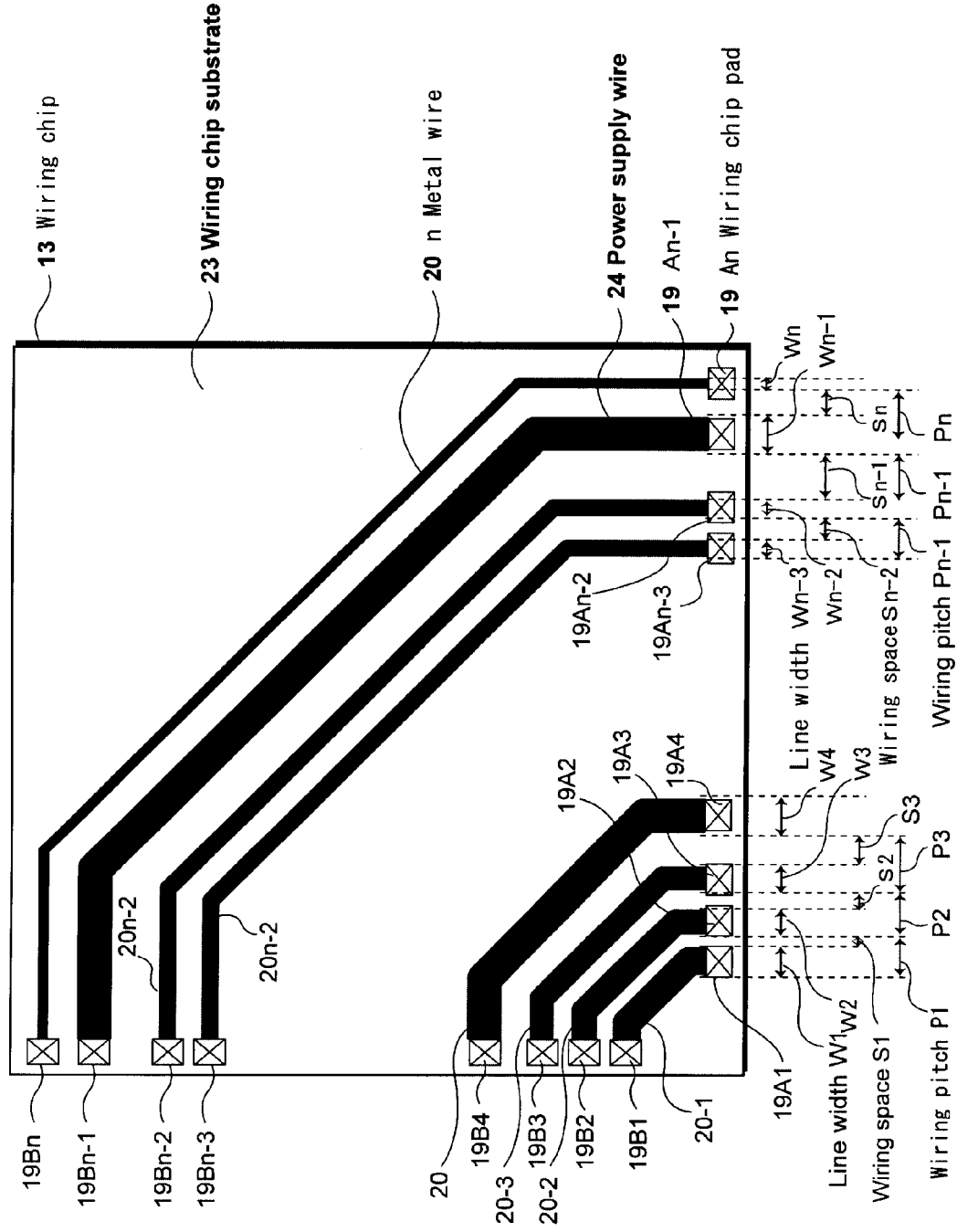
FIG. 8 is a plan view of a wiring pattern of a wiring chip of a semiconductor device according to a fifth embodiment of the present invention.

FIG. 8 is a plan view of a wiring pattern of a wiring chip of a semiconductor device according to the fifth embodiment of the present invention. As shown in FIG. 8, on a wiring chip substrate 23 of the wiring chip 13, a plurality of wiring chip pads 19A through 19An and a plurality of wiring chip pads 19B1 through 19Bn are respectively located inside two adjacent side of the four sides of the wiring chip 13 with an equal number (n number).

The wiring chip pads 19A1 through 19An and the wiring chip pads 19B1 through 19Bn are connected to each other by metal wires 20-1 through 20n respectively in the wiring chip 13, sequentially from the wiring chip pads closest to a contact point on the two sides. The metal wires 20-1 through 20n have a trapezoid upper shape in order to be shortened.

The line widths W1 through Wn of the metal wires 20-1 through 20n of the trapezoid upper shape are not equal. For example, the outermost metal wire 20n which is relatively long and thus has the relatively large capacitance with the adjacent metal wire 20n−1 is set to have a relatively narrow line width Wn. The line width W is set to be gradually increased as being closer to the innermost metal wire 20-1 which is relatively short and has a relatively small capacitance with the adjacent metal wire 20-2. The innermost wiring space S1 is set to be narrowest, and the wiring space S is set to be gradually increased as being closer to the outermost wiring space Sn regarding the outermost metal wire 20n which is relatively long and having a relatively large capacitance with the adjacent metal wire 20n−1.

Depending on the structure of the ASIC or the like mounted on the MCP, it may be necessary to provide a power supply wire 24 on the wiring chip substrate 23. The power supply wire 24 is generally wider than the other metal wires 20, and therefore the capacitance per unit between the power supply wire 24 and the wiring chip substrate 23 is larger. As a result, the difference in the wiring capacitance between adjacent wires in the wiring chip 13 is conspicuous. For this reason, the power supply wire 24 needs to be as short as possible and needs to be provided with a large wiring space S with the adjacent metal wire 20.

The wiring pattern of the wiring chip of the semiconductor device according to the fifth embodiment of the present invention can shorten the length of the power supply wire 24 owing to the trapezoid upper shape. In addition, since the wiring space S is adjustable at the time of designing, a sufficiently wide wiring space S can be guaranteed even with the power supply wire 24 which is wider than the other metal wires 20. As a result, the influence of the power supply wire 24 on the other metal wires 20 can be suppressed. Although not shown, in an MCP including the wiring chip 13 according to the fifth third embodiment also, the length of the bonding wires 21 can be suppressed from being extended like in FIG. 2. This is applicable even when the number of memory chips 11 stacked on the MCP substrate 10 is significantly increased or when the number of ASICs 12 mounted on the MCP is significantly increased.

Sixth Embodiment

While the number of semiconductor memories, ASICs, or the like mounted on MCPs increases, the size of the MCPs themselves is more and more decreased in response to the demand to reduce the mounting area. When the size of the MCPs is more decreased and accordingly the number of semiconductor memories or ASICs mounted on MCPs increases in the future, it is expected that a plurality of memory chips, and a plurality of ASICs for different uses, need to be provided. In such a case, the number of wires in the wiring chip is increased, and it may be necessary to extend the wires in two different directions from one wiring chip.

In the case where the memory chips and the ASICs have significantly different sizes, the ASICs may be stacked on the memory chips. For example, when a plurality of ASICs for different uses are used, the number of wiring chips needs to be increased, which increases the cost of the MCP. For example, in the case where an ASIC having ASIC pads along the periphery thereof is stacked on the memory chip with wiring, it is common to locate the ASIC in the vicinity of one of the four corners of the memory chip and to provide two wiring chips. Accordingly, in the case where two ASICs are used, four wiring chips are necessary. This increases the cost of the MCP. Occasionally, six chips including two ASICs and four wiring chips may not be provided due to the restricted mounting area of the MCP or the like. In order to solve these problems, it is required to increase the number of wires which can be provided on each wiring chip and also to arrange the wires such that signals are input/output in two different directions.

Figure 16:
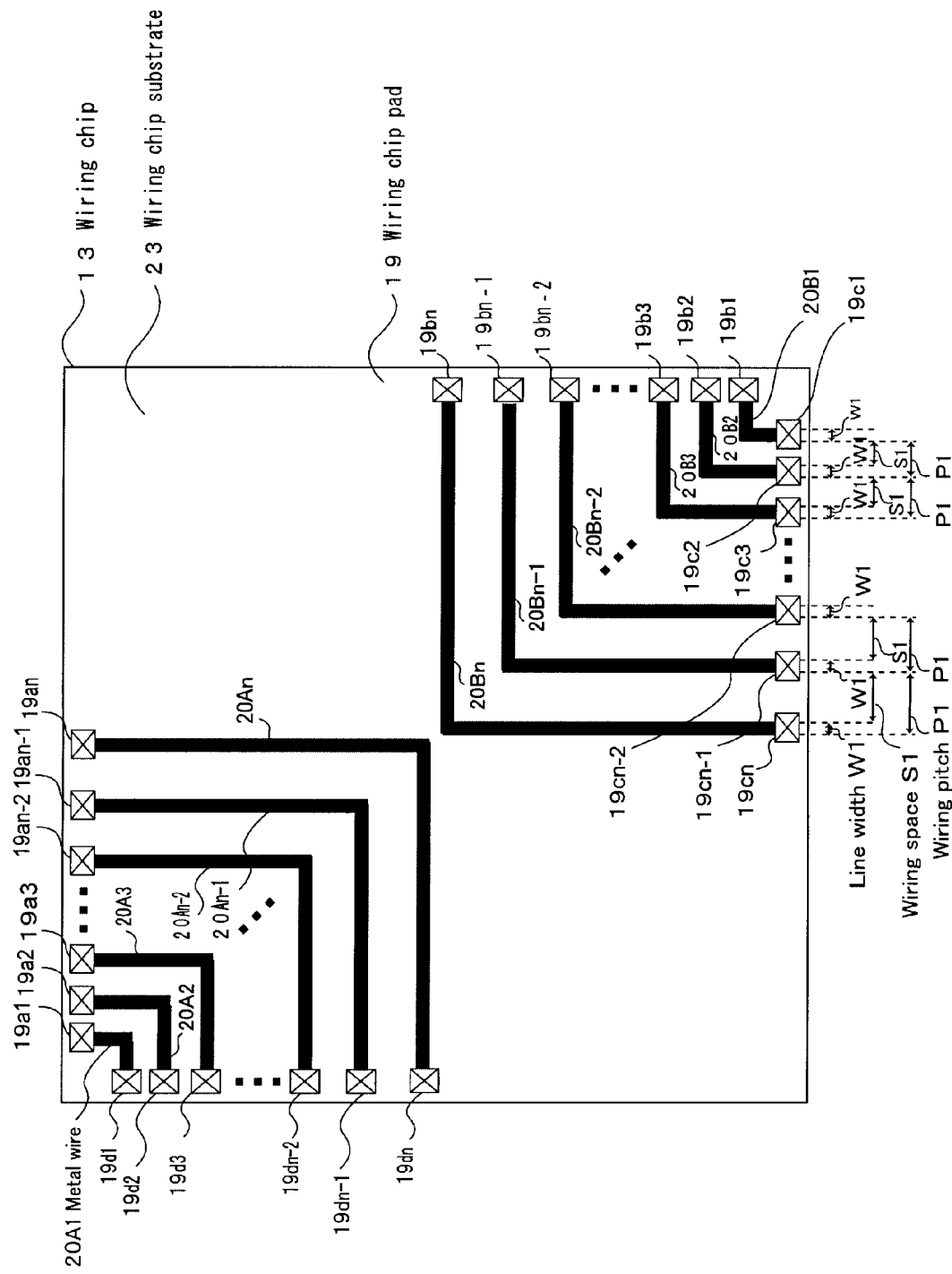
FIG. 16 is a plan view of a wiring chip including L-shaped metal wire at an equal pitch to provide input/output in two different directions.

In the above-described case, a wiring pattern with L-shaped wires located at an equal wiring pitch cannot allow the number of wires to be increased. FIG. 16 is a plan view of a wiring chip including L-shaped metal wires 20 located at an equal wiring pitch and arranged such that signals are input/output in two different directions. When the metal wires 20 are arranged such that signals are input/output in two different directions in FIG. 16, the apexes of the L-shaped metal wires 20 may contact each other in a central part of the wiring chip. In order to avoid this, the wiring chip pads 19 can only located in an area corresponding to a half or less of each side of the wiring chip. For this reason, the number of the metal wires 20 cannot be increased.

Figure 9:
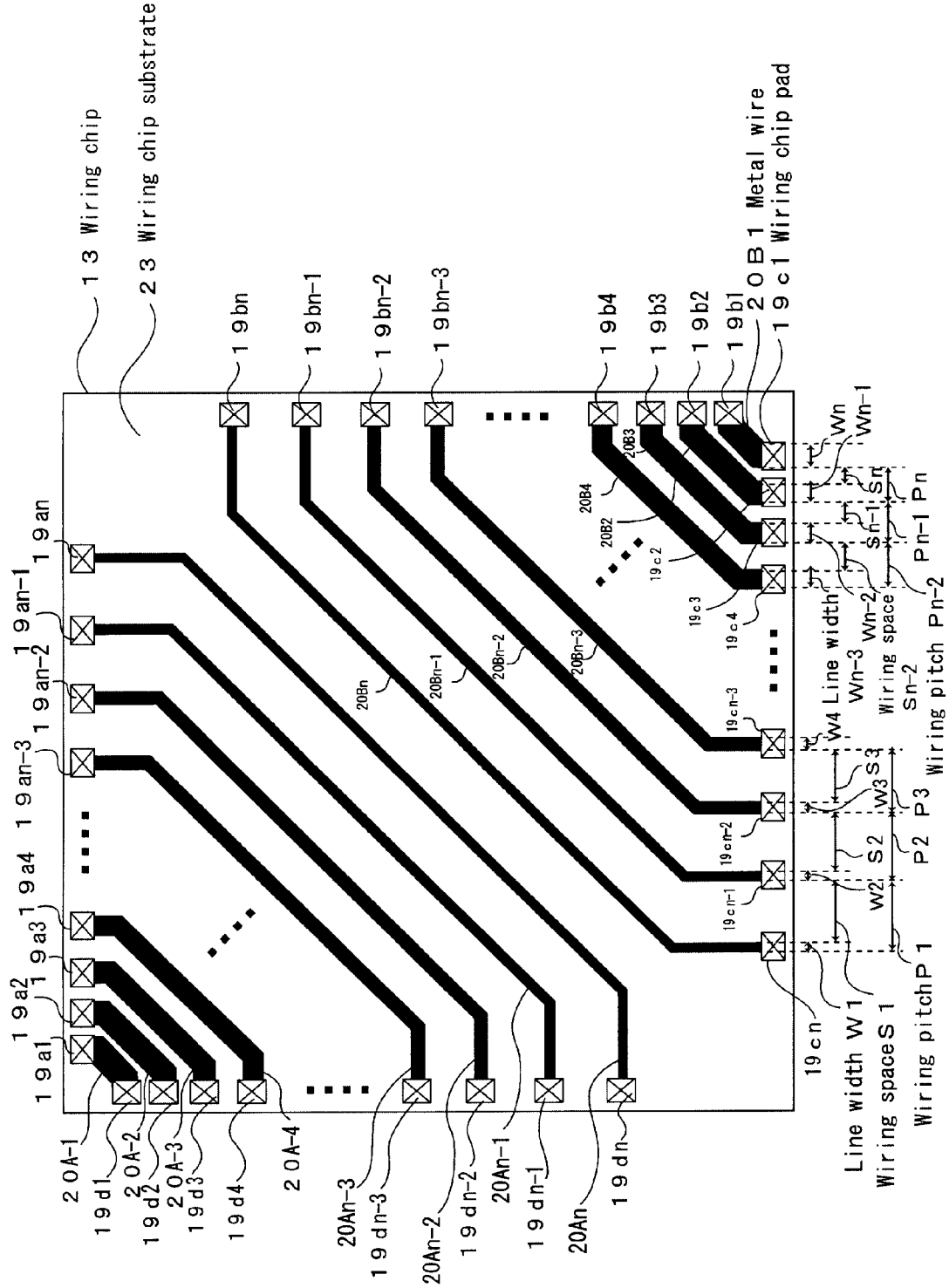
FIG. 9 is a plan view of a wiring pattern of a wiring chip of a semiconductor device according to a sixth embodiment of the present invention.

FIG. 9 is a plan view showing a wiring pattern of a wiring chip of a semiconductor device according to a sixth embodiment of the present invention. As shown in FIG. 9, wiring chip pads 19a through 19d are respectively located inside the four sides of the wiring chip 13. The wiring chip pads 19a1 through 19an along the top side in FIG. 9 and the wiring chip pads 19d1 through 19dn along the left side in FIG. 9 are connected to each other by metal wires 20A1 through 20An respectively, sequentially from the wiring chip pads closest to the contact point of the top side and the left side. Similarly, the wiring chip pads 19c1 through 19cn along the bottom side in FIG. 9 and the wiring chip pads 19b1 through 19bn along the right side in FIG. 9 are connected to each other by metal wires 20B1 through 20Bn respectively, sequentially from the wiring chip pads closest to the contact point of the bottom side and the right side. Thus, the wiring chip 13 can provide connections in two different directions, i.e., between the left side and top side in FIG. 9, and between the right side and bottom side in FIG. 9.

The metal wires 20A1 through 20An and the metal wires 20B1 through 20Bn are arranged such that the metal wires 20A1 and 20B1 which are relatively short have a relatively wide line width Wn, and the metal wires 20An and 20Bn which are relatively long have a relatively narrow line width W1. In both of two groups of metal wires 20 extended in two different directions, the wiring spaces S1 through Sn are set to be increased as being closer to the outermost wiring space S1. Therefore, in each group of metal wires 20, the difference in the wiring capacitance between adjacent metal wires 20 can be decreased. Thus, the wiring pattern of the wiring chip of the semiconductor device according to the sixth embodiment of the present invention can adjust the wiring pitch P, and therefore can provide a greater number of metal wires, as compared to the case shown in FIG. 16 where the L-shaped metal wires are arranged at an equal line width W, an equal wiring space S and an equal wiring pitch P.

Figure 10:
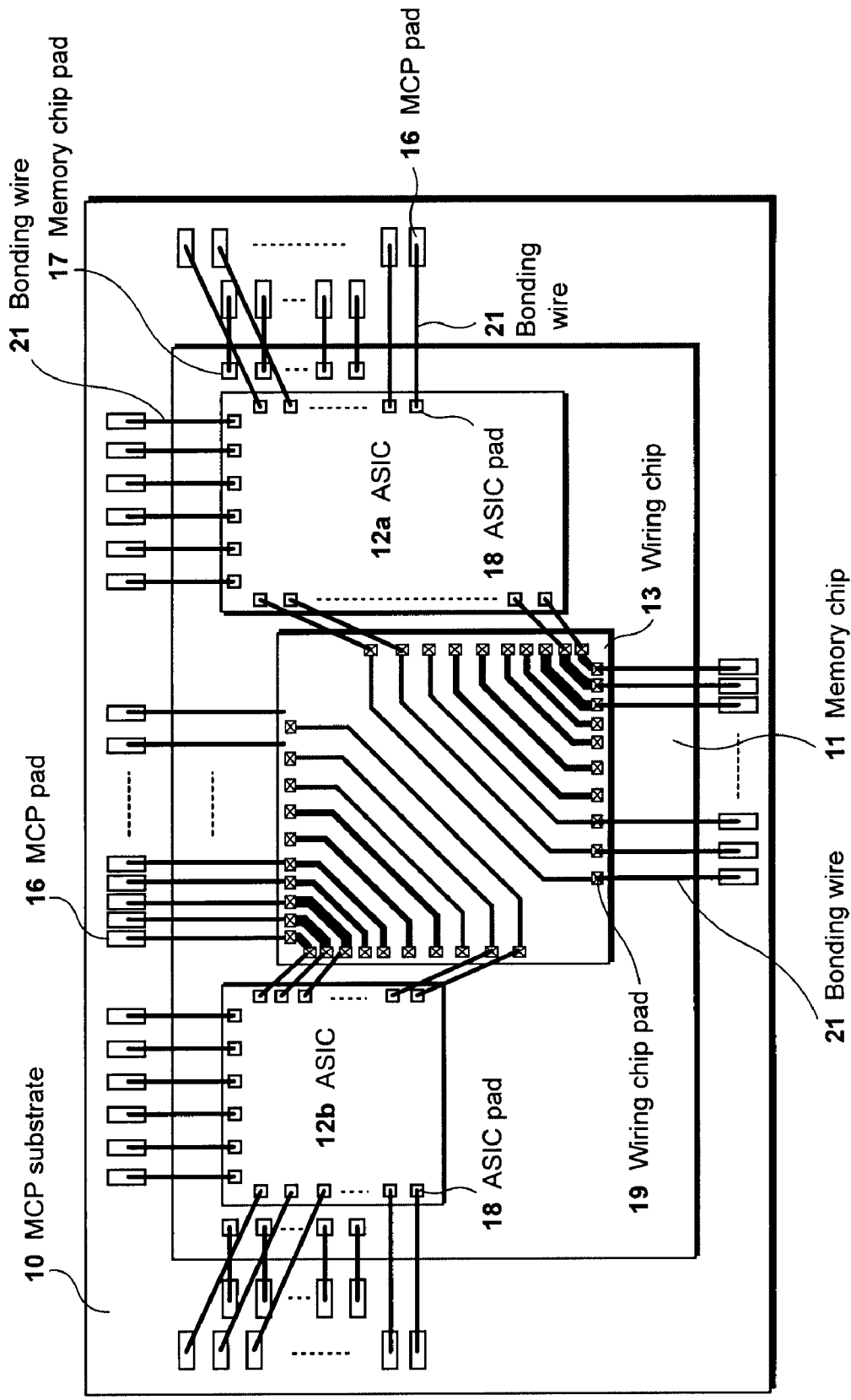
FIG. 10 is a plan view of a semiconductor device according to the sixth second embodiment of the present invention, which includes a plurality of ASICs.

FIG. 10 is a plan view of a semiconductor device according to the sixth embodiment of the present invention. As shown in FIG. 10, a memory chip 11 and two ASICs 12a and 12b are stacked on the MCP substrate 10. The two ASICs 12a and 12b are located in the vicinity of the top right corner and the top left corner as shown in FIG. 10 among the four corners of the memory chip 11. For the wiring chip pads 19 along the left side of the ASIC 12a at the top right corner as shown in FIG. 10, and for the wiring chip pads 19 along the right side of the ASIC 12b at the top left corner as shown in FIG. 10, the length of the bonding wires 21 is limited. Therefore, it is difficult to connect these wiring chip pads 19 to the MCP pads 16 of the MCP substrate 10. In order to avoid this problem, the wiring chip 13 shown in FIG. 9 adopting the wiring pattern of the semiconductor device according to the sixth embodiment of the present invention is located in a central part of the memory chip 11.

The wiring chip 13 is larger than the ASICs 12a and 12b in order to shorten the bonding wires 21 for connecting the wiring chip 13 with the ASICs 12a or 12b. The wiring chip pads 19 inside the four side of the wiring chip 13 are connected as described below with reference to FIG. 9. The wiring chip pads 19a1 through 19an along the top side in FIG. 9 and the wiring chip pads 19d1 through 19dn along the left side in FIG. 9 are connected to each other by metal wires 20A1 through 20An respectively. Similarly, the wiring chip pads 19c1 through 19cn along the bottom side in FIG. 9 and the wiring chip pads 19b1 through 19bn along the right side in FIG. 9 are connected to each other by metal wires 20B1 through 20Bn respectively.

Returning to FIG. 10, the wiring chip pads 19 of the wiring chip 13 and the ASIC pads 18 of the ASICs 12a and 12b are connected to each other by the bonding wires 21. The wiring chip pads 19 of the wiring chip 13, the ASIC pads 18 of the ASICs 12a and 12b, memory chip pads 17 of the memory chip 11, and MCP pads 16 of the MCP substrate 10 are connected by the bonding wires 21.

As shown in FIG. 10, the ASIC pads 18 along the right side of the ASIC 12b on the top left corner of the memory chip 11 as shown in FIG. 10 are connected to the MCP pads 16 on a top part of the MCP substrate 10 as shown in FIG. 10 via the wiring chip 13. Similarly, the ASIC pads 18 along the left side of the ASIC 12a on the top right corner of the memory chip 11 as shown in FIG. 10 are connected to the MCP pads 16 on a bottom part of the MCP substrate 10 as shown in FIG. 10 via the wiring chip 13. Accordingly, one wiring chip 13 provides connections in two different directions, and thus the cost of the MCP can be reduced.

As described above, the wiring pattern of the wiring chip of the semiconductor device according to the sixth embodiment of the present invention can provide connections in two different directions, while decreasing the difference in the wiring capacitance and the difference in the wiring resistance between adjacent metal wires of the wiring chip. The wiring pattern according to the sixth embodiment can also reduce the cost of the MCP. In an MCP including the wiring chip 13 according to the sixth embodiment also, the length of the bonding wires 21 can be suppressed from being extended like in FIG. 2. This is applicable even when the number of memory chips 11 stacked on the MCP substrate 10 is significantly increased or when the number of ASICs 12 mounted on the MCP is significantly increased. Especially by using the wiring chip 13 according to the sixth embodiment, the length of the bonding wires 21 for connecting the left and right ASICs 12a and 12b with the MCP substrate 10 can be shortened. Therefore, even where the number of memory chips 11 and the ASICs 12 is increased with the integration being progressed, these elements can be connected by wire bonding with no need for any specific connection method. Thus, an increase of the cost of the MCP can be suppressed.

Seventh Embodiment

In a semiconductor device according to a seventh embodiment of the present invention, the memory capacity can be increased in an MCP including a plurality of memory chips such as a microSD card or the like by arranging wires having a trapezoid upper shape with the line width W adjustable at the time of designing, the wiring space S adjustable at the time of designing and the wiring pitch P adjustable at the time of designing.

For example, a microSD card, which is a super-compact SD card, has an outer dimension of 11.0 mm (W)×15.0 mm (D)×1.0 mm (H). As compared to the SD card, the microSD card is about half in thickness and 1/4.65 in surface area. The microSD card is not generally rectangular in shape, but has a cutaway portion at one of four corners of the rectangular shape and also has a generally C-shaped cutout portion for securing the microSD card when inserted into a slot of a cellular phone or the like. Accordingly, when mounting a memory chip on the micro SC card, it is necessary to stack the ASIC and the like in order to guarantee the maximum possible capacity of the memory chip. In order to connect the stacked chips, a wiring chip is necessary.

As described above, a microSD card is smaller than the SD card with the surface area being 1/4.65. This requires the size of the ASIC and the wiring chip mounted thereon to be reduced. Since the microSD card has a unique shape, it is expected that the wiring chip to be mounted is also required have a unique shape in accordance with the shape of the microSD card, instead of a rectangular shape, as the capacity of the memory chip is increased. The semiconductor device according to the seventh embodiment of the present invention can fulfill the demand for an increased capacity of the microSD card.

Figure 11:
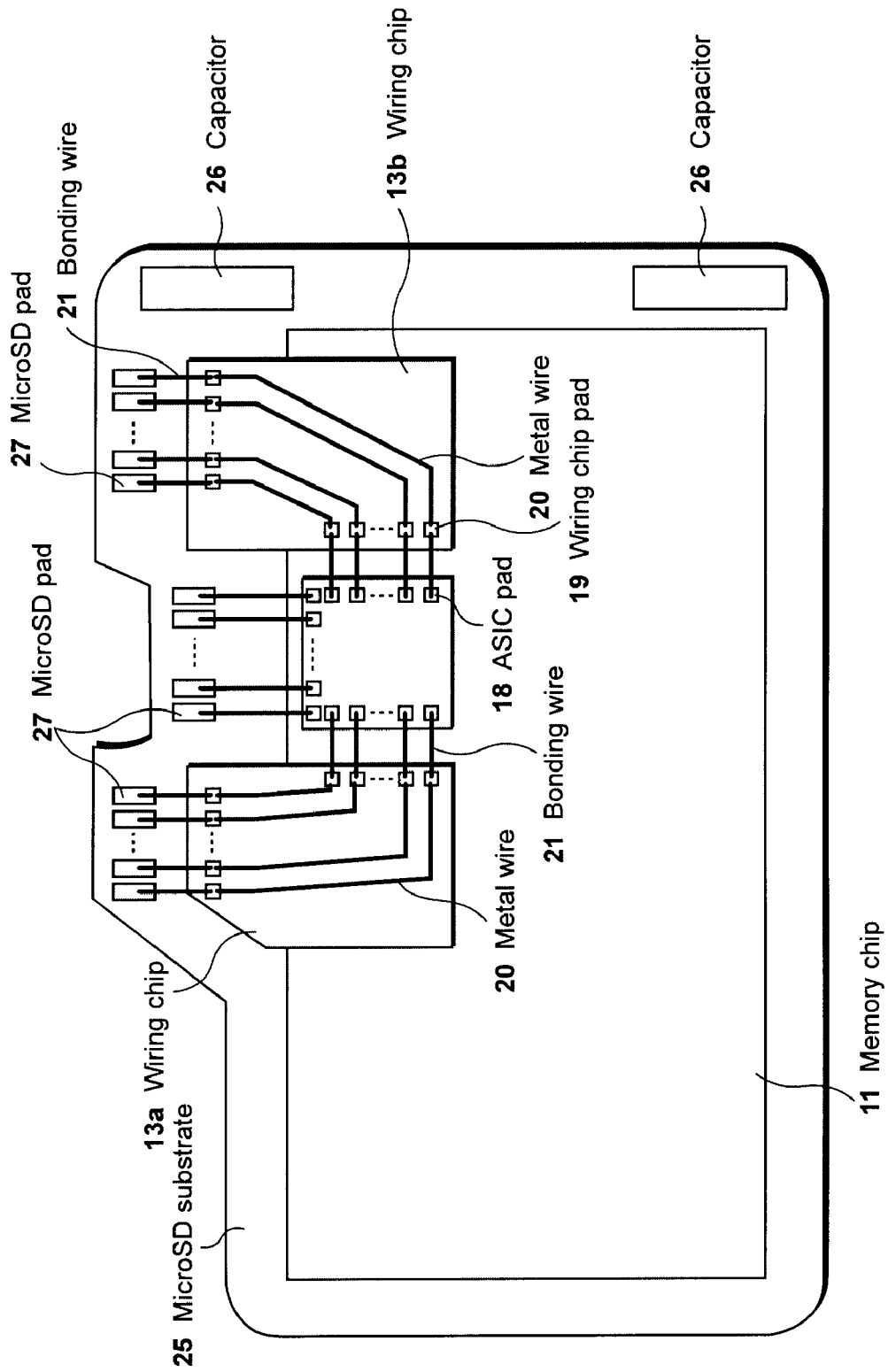
FIG. 11 is a plan view of a microSD card according to a seventh embodiment of the present invention.

FIG. 11 is a plan view of a microSD card applying the semiconductor device according to the seventh embodiment of the present invention. With reference to FIG. 11, the microSD card will be described.

As shown in FIG. 11, on a microSD substrate 25, two capacitors 26, a memory chip 11, an ASIC 12, and a wiring chip 13 are mounted.

In the example of FIG. 11, the memory chip 11 is provided with a maximum possible size as limited by the inner size of the microSD substrate 25 excluding the locations of the capacitors 26. In this case, the size of the memory chip 11 is significantly different from the size of the ASIC 12 mounted thereon. Therefore, the wiring chip 13 is required for connecting the memory chip 11 and the ASIC 12. The microSD substrate 25 needs to have an area for locating microSD pads 27 which are to be connected with the memory chip 11 and the like. In order to maximize the size of the memory chip 11, it is considered to effectively use a top area of the microSD substrate 25 as shown in FIG. 11 having the generally C-shaped cutout portion as an area for locating the microSD pads 27, instead of the left area as shown in FIG. 11 which is to be inserted into a cellular phone or the like.

Where the microSD pads 27 are located in the area having the generally C-shaped cutout portion, the ASIC 12 is not located in the vicinity of one of the four corners of the memory chip 11, but is located in an area adjacent to the area having the generally C-shaped cutout portion in which the microSD pads 27 are located. In this case, ASIC pads 18 of the ASIC 12 are connected to the microSD pads 27 via two wiring chips 13a and 13b located to the left and to the right of the ASIC 12 as sandwiching the ASIC 12, as shown in FIG. 11.

With the microSD card according to the seventh embodiment, even where the wiring chip does not have a rectangular shape but has a cutaway portion at one of four corners of the rectangular shape, the number of connection wires is allowed to be increased while the difference in the wiring capacitance is decreased. This is realized by arranging, in the wiring chip, the metal wires having a trapezoid upper shape with the line width W adjustable at the time of designing, the wiring space S adjustable at the time of designing and the wiring pitch P adjustable at the time of designing. Therefore, even where the wiring chip 13 is formed to have a shape in conformity to the unique shape of the top area of the microSD substrate 25 as shown in FIG. 11, a desired number of wires can be guaranteed.

As shown in FIG. 11, among the wiring chips 13a and 13b located as sandwiching the ASIC 12, the wiring chip 13a is not rectangular but is pentagonal as a result of one of the four corners of the rectangular shape being cut away in conformity to the shape of the microSD substrate 25. Using the wires having a trapezoid upper shape according to one embodiment of the present invention, even the wiring chip 13a with such a unique shape can be connected while a desired number of wires is guaranteed. In the case where the wiring chip pads 19 of the wiring chips 13a and 13b are arranged zigzag as described above in the third embodiment, the wiring chip pads 19 can be provided by a greater number even in the above-mentioned unique, small area than in the case where the wiring chip pads 19 are located in one line. Thus, it is easier to guarantee a required number of wires.

With the above-described wiring of the wiring chips 13a and 13b, there is a possibility that the wiring capacitance and the wiring resistance may be different between adjacent wires. Such a difference in the wiring capacitance and the wiring resistance can be decreased by appropriately combining the line width W adjustable at the time of designing, the wiring space S adjustable at the time of designing and the wiring pitch P adjustable at the time of designing.

Eighth Embodiment

A semiconductor device according to an eighth embodiment of the present invention can provide direction conversion in a transverse direction of the bonding wires for connecting the chips in the MCP and can reduce the relaying cost of the bonding wires.

Figure 17:
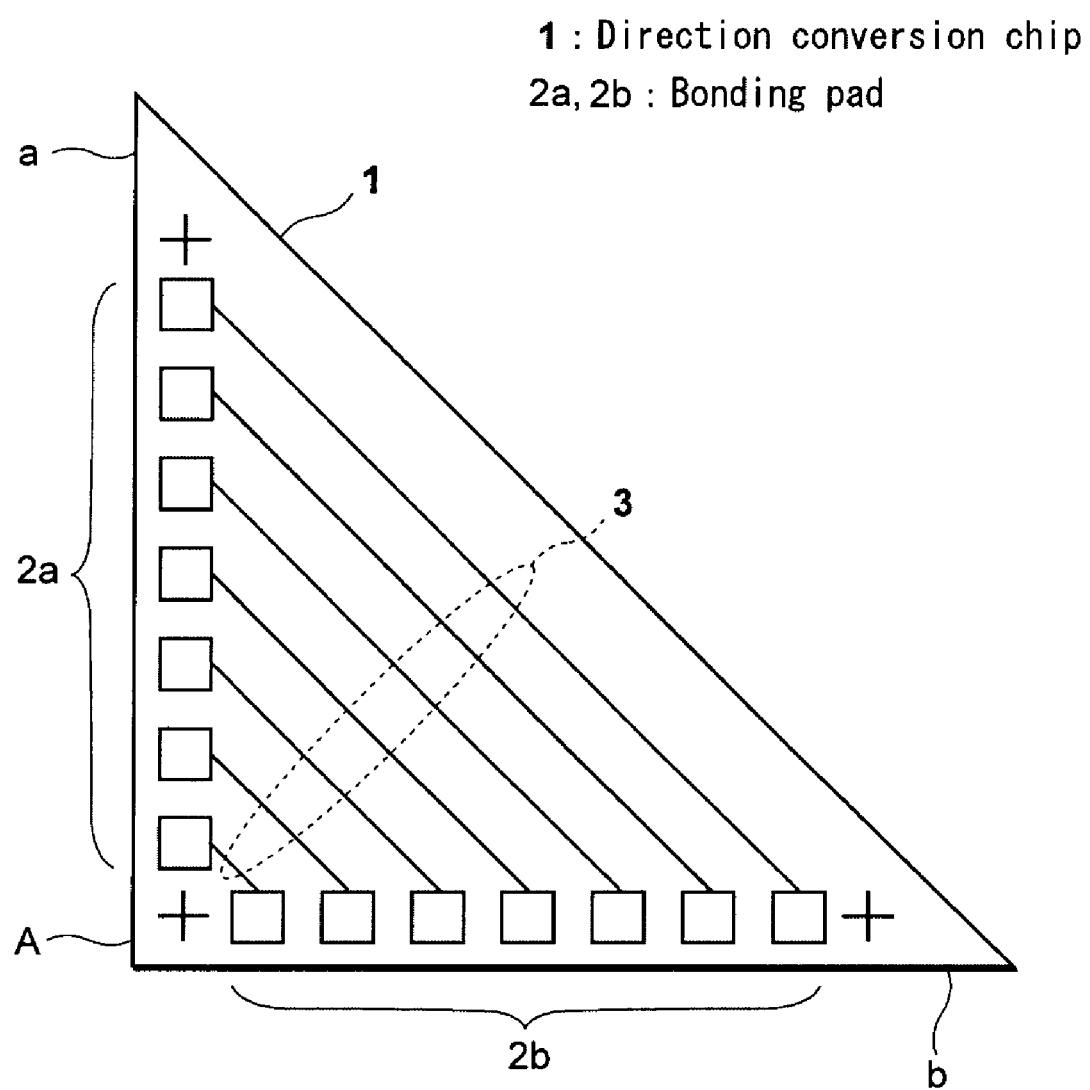
FIG. 17 is a view showing a schematic structure of a relay chip according to an eighth embodiment of the present invention.

FIG. 17 shows a schematic structure of a relay chip applicable to the semiconductor device according to the eighth embodiment of the present invention. A relay chip 1 has a triangular structure, and includes an equal number of (seven in FIG. 17) bonding pads 2a and 2b along each of a side a and a side b. The first bonding pad 2a from an apex A and the first bonding pad 2b from the apex A are connected to each other by a wire 3. The second bonding pad 2a from the apex A and the second bonding pad 2b from the apex A are connected to each other by a wire 3. Similarly, corresponding bonding pads 2a and 2b are connected to each other by a wire 3.

FIG. 18 shows a schematic view of a semiconductor device applying the triangular relay chip as shown in FIG. 17. On a circuit substrate 21, a memory chip 22 is provided. On the memory chip 22, relay chips 1a and 1b and a logic chip 23 are provided. Bonding pads 24 of the logic chip 23 and bonding pads 26 of the circuit substrate 21 are connected to each other via the relay chip 1a. Bonding pads 25 of the logic chip 23 and bonding pads 27 of the circuit substrate 21 are connected to each other via the relay chip 1b. By using the relay chips 1a and 1b, the bonding pads 24 and 25 of the logic chip 23 and the bonding pads 26 and 27 of the circuit substrate 21, which are not easily connected directly, can be easily connected.

Figure 19:
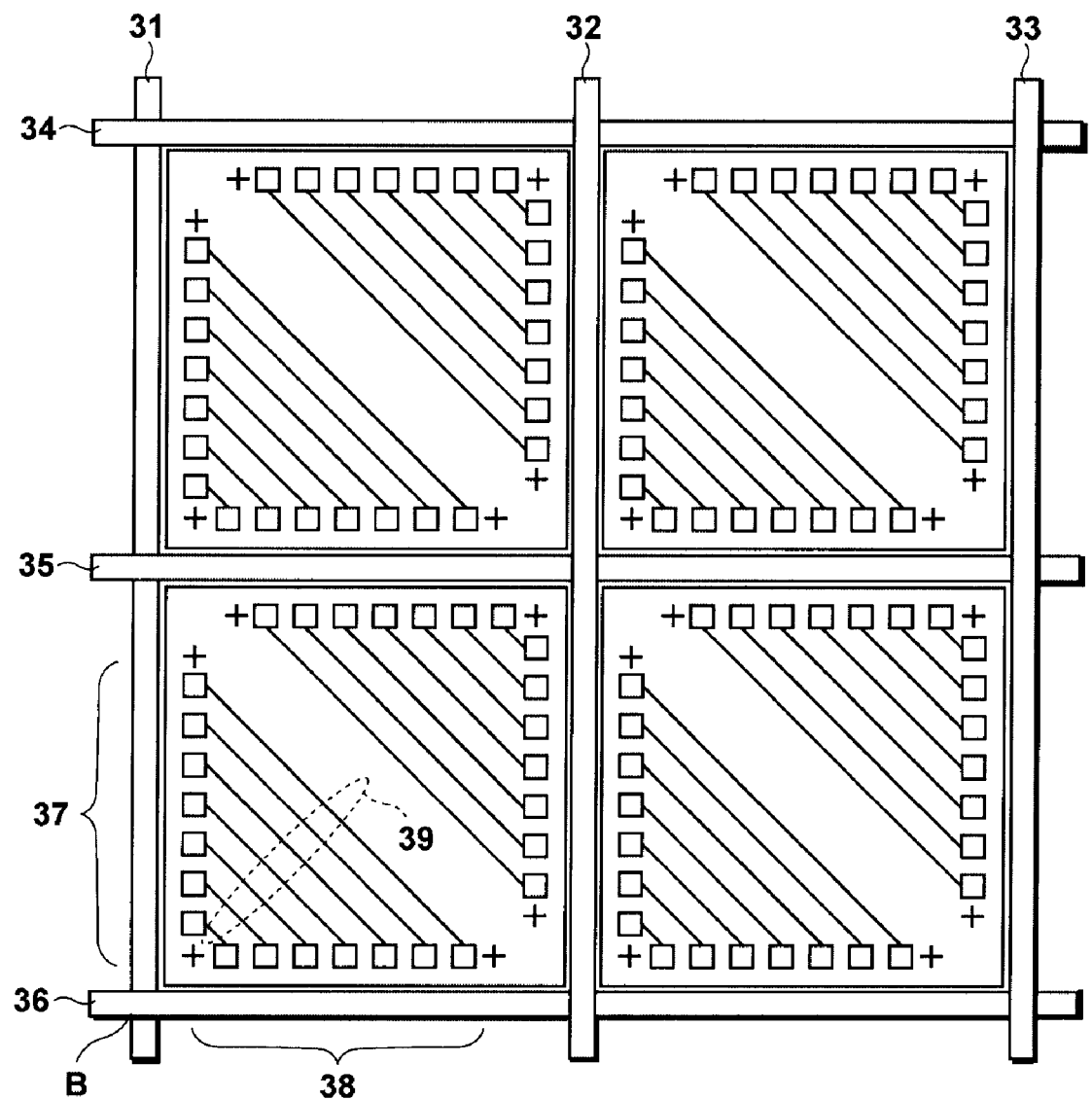
FIG. 19 is a view showing a layout of a semiconductor wafer according to the eighth embodiment of the present invention.

Next, a method for producing such triangular relay chips will be described. FIG. 19 shows an exemplary layout of a wafer usable for producing the relay chips. Cut lines 31 through 36 surround quadrangles. A plurality of (seven in FIG. 19) bonding pads are provided along each side of each quadrangle. Metal wires each for connecting each bonding pad and a corresponding pad are provided. For example, bonding pads 37 and 38 which are each the p'th pad (p is an integer fulfilling $1 \leq p \leq 7$) from an apex B are connected to each other by a metal wire 39. The bonding pads and the metal wires are formed by proving a metal film on the wafer, then forming a resist mask on the metal film, etching the metal film by photolithography, and then removing the resist mask.

Figure 20:
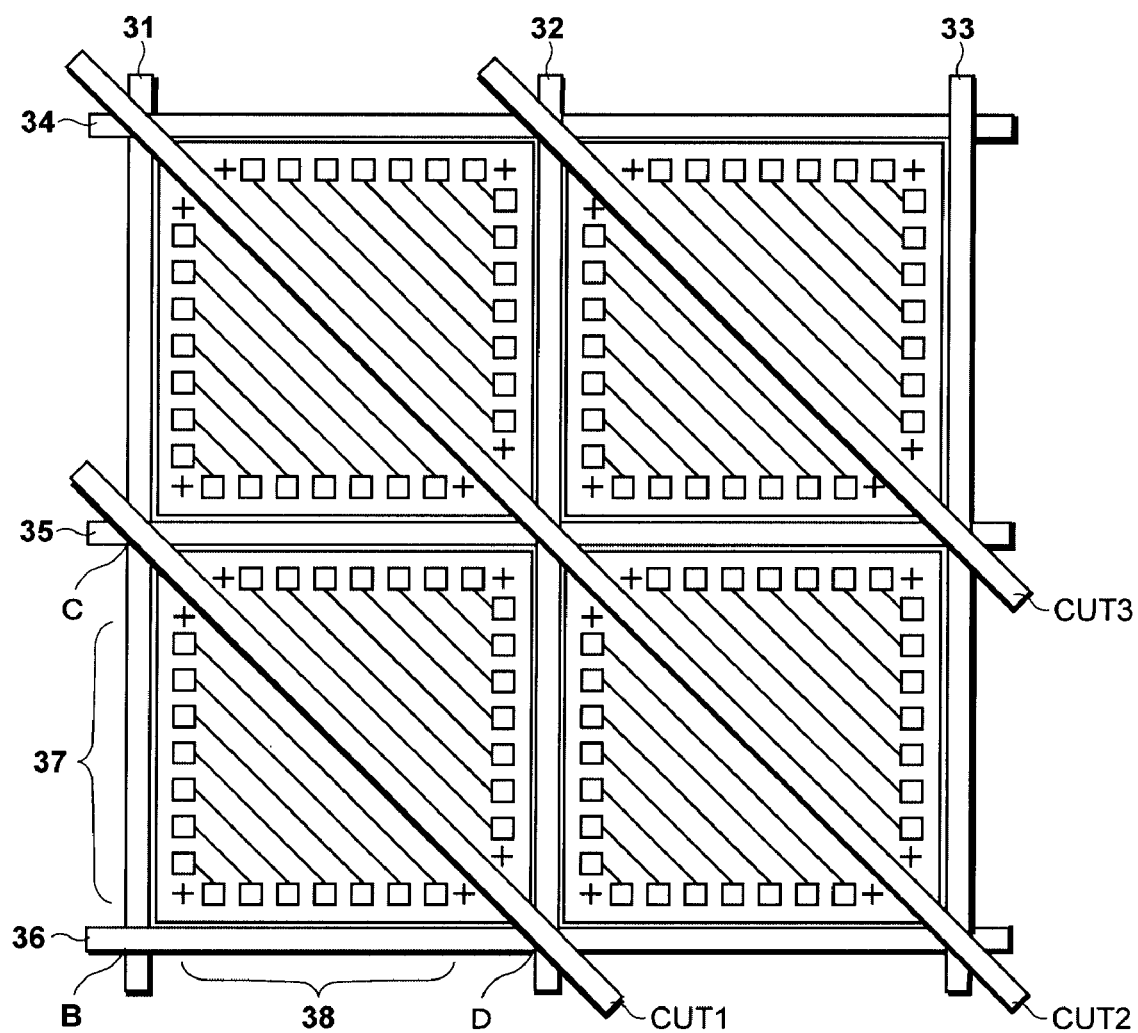
FIG. 20 is a view showing a layout of a semiconductor wafer according to the eighth embodiment of the present invention.

FIG. 20 shows cut lines of the wafer usable for producing the triangular relay chips. The cut lines are represented with the reference numerals 31 through 36 and CUT1 through CUT3. The cut lines CUT1 through CUT3 are along a diagonal line of the quadrangles defined by the cut lines 31 through 36. For example, the cut line CUT1 is along a diagonal line of the quadrangle surrounded by the cut lines 31, 32, 35 and 36 (i.e., the straight line connecting apexes C and D).

By cutting the wafer along the cut lines 31 through 36 and CUT1 through CUT3 with a blade, triangular relay chips can be produced. As the material of the wafer, a semiconductor material such as silicon or the like is usable. The material of the wafer may be the same as the material used for, for example, the circuit substrate on which the relay chips are to be mounted. As the material of the circuit substrate, for example, a polyimide material or a glass epoxy material is usable. As the material of the metal wires, for example, aluminum, copper, nickel, or gold is usable.

Figure 21:
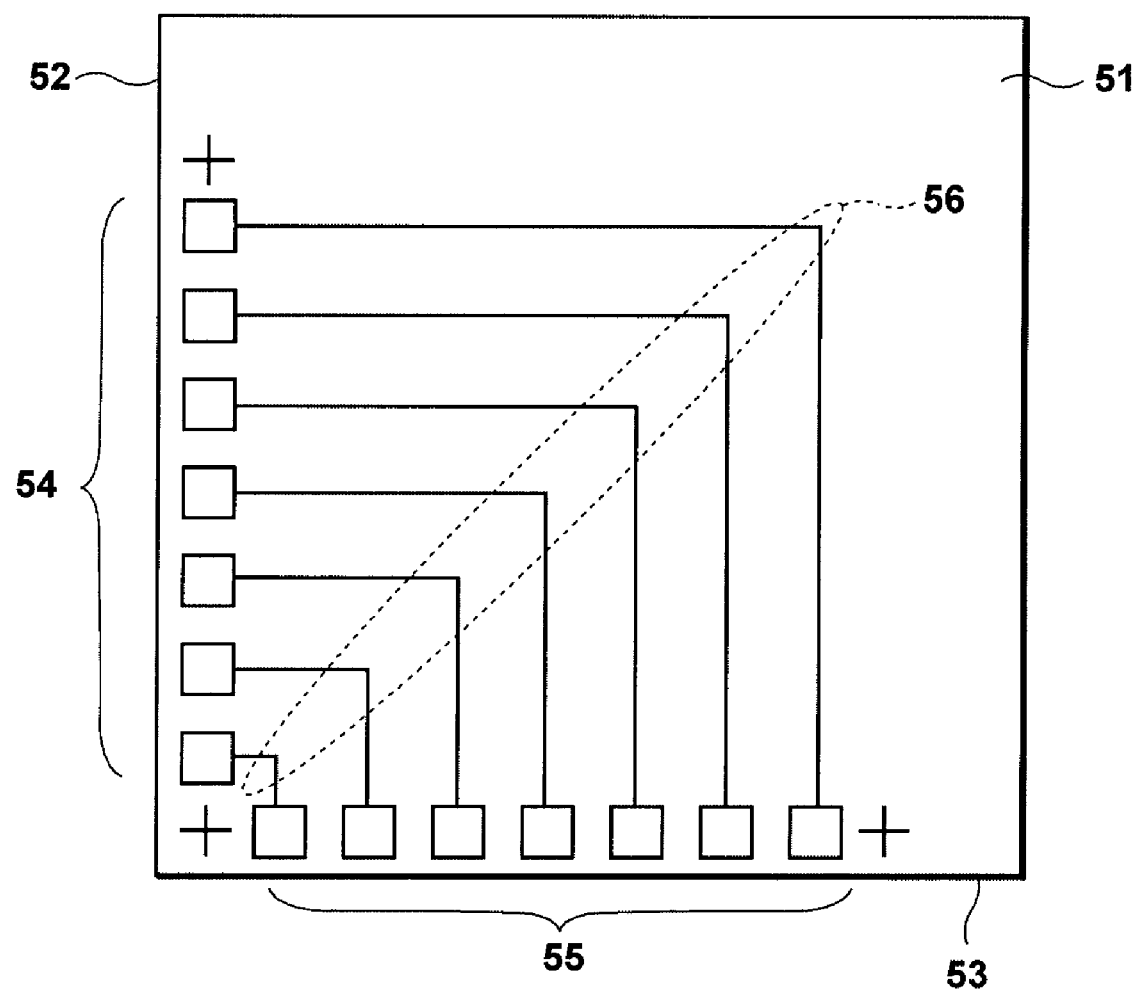
FIG. 21 is a view showing a schematic structure of a comparative example to the relay chips according to the eighth embodiment of the present invention.

FIG. 21 shows a schematic view of another relay chip. A relay chip 51 has a quadrangular shape, and includes a plurality of (seven in FIG. 21) bonding pads 54 and 55 along each of a side 52 and a side 53. Corresponding bonding pads 54 and 55 are connected to each other by wires 56 respectively. The wires 56 are formed of lines parallel to the sides 52 and 53.

The relay chips according to the eighth embodiment are obtained by cutting a quadrangular shape along a diagonal line. Therefore, the wafer gross is twice that in the above-described other embodiments.

Accordingly, the semiconductor device according to the eighth embodiment can provide direction conversion in the transverse direction of the bonding wires and also provide the relay of the bonding at reduced cost.

Figure 22:
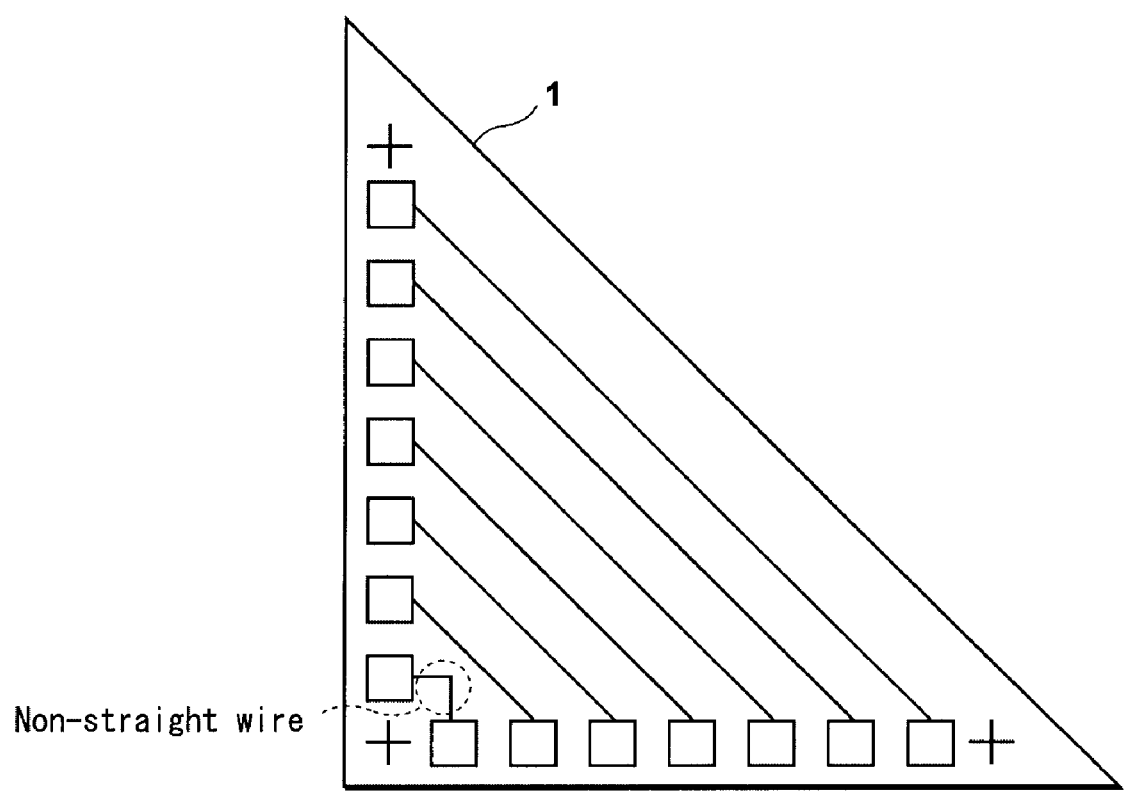
FIG. 22 is a view showing a schematic structure of a relay chip according to the eighth embodiment of the present invention.

The relay chips shown in the eight embodiment are exemplary and the present invention is not limited to such structures. For example, as shown in FIG. 22, the wires for connecting the bonding pads of a triangular relay chip may include a non-straight wire. The number of the bonding pads along one of the two sides of the triangular relay chip may be different from the number of the bonding pads along the other side.

Figure 23:
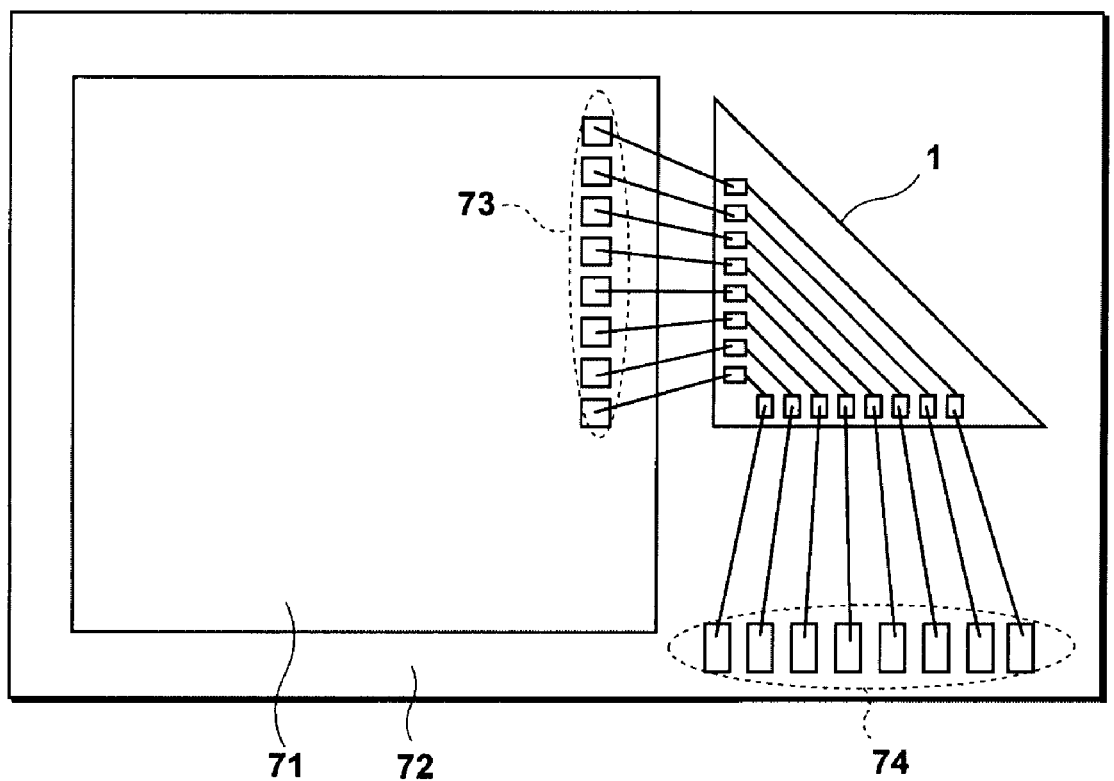
FIG. 23 is a view showing a schematic structure of a semiconductor device according to the eighth embodiment of the present invention.

As shown in FIG. 23, a semiconductor chip 71 and a relay chip 1 may be provided on a circuit substrate 72, and bonding pads 73 of the semiconductor chip 71 and bonding pads 74 of the circuit substrate 72 may be connected to each other via the relay chip 1. Alternatively, as shown in FIG. 24, a semiconductor chip 81 may be provided on a circuit substrate 82, and bonding pads 83 of the semiconductor chip 81 and bonding pads 84 of the circuit substrate 82 may be connected to each other via the relay chip 1.

Ninth Embodiment

The relay chips described above as examples in the eighth embodiment are triangular. This triangular shape is applicable to, for example, the wiring chip 13 described in the sixth embodiment. A wiring chip according to a ninth embodiment of the present invention can suppress the wiring capacitance between adjacent wires while increasing the number of the wires, and also can reduce the mounting area of the wiring chip more effectively. This is realized by arranging metal wires having a trapezoid upper shape with an appropriate combination of the line width W adjustable at the time of designing, the wiring space S adjustable at the time of designing and the wiring pitch P adjustable at the time of designing, and also shaping the entire relay chip to be triangular. The triangular wiring chip according to the ninth embodiment of the present invention includes wiring chip pads located along two sides thereof, which are connected to each other by metal wires having a trapezoid upper shape respectively. In addition, the metal wires are arranged with the line width W adjustable at the time of designing, the wiring space S adjustable at the time of designing and the wiring pitch P adjustable at the time of designing.

Figure 25:
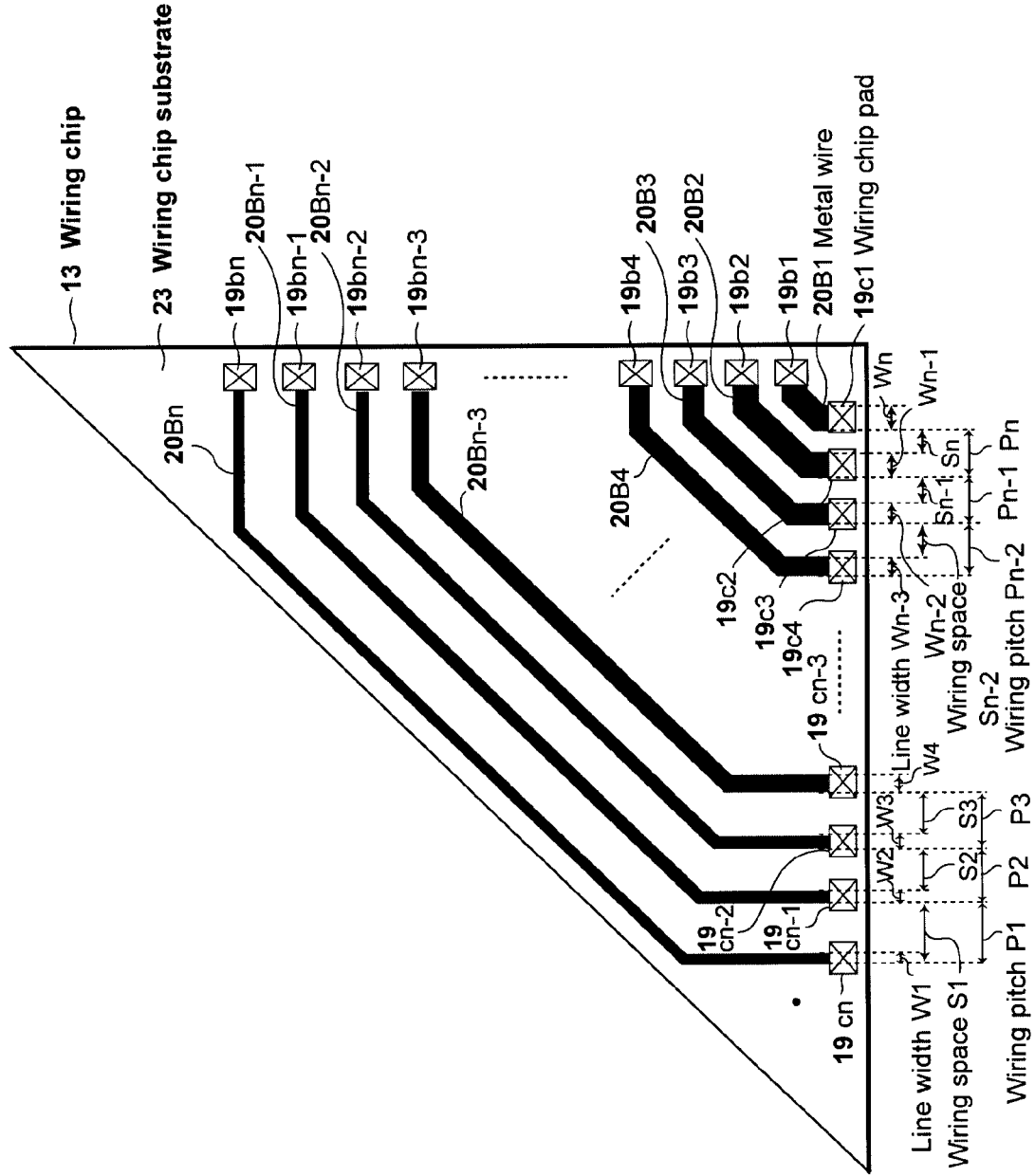
FIG. 25 is a plan view of a wiring pattern of a wiring chip of a semiconductor device according to a ninth embodiment of the present invention.

FIG. 25 is a plan view showing a wiring pattern of a wiring chip 13 according to the ninth embodiment of the present invention. As shown in FIG. 25, wiring chip pads 19$b$ and 19$c$ are provided inside two sides of the triangular wiring chip 13. The wiring chip pads 19$c$1 through 19$cn$ located along a bottom side as shown in FIG. 25 and the wiring chip pads 19$b$1 through 19$bn$ located along a right side as shown in FIG. 25 are connected to each other by metal wires 20B1 through 20Bn respectively, sequentially from the wiring chip pads closest to the contact point of the two sides. Therefore, the wiring chip 13 can provide connections in two different directions between the right side and bottom side in FIG. 25.

The metal wires 20B1 through 20Bn are set such that the relatively short metal wire 20B1 has a relatively wide line width Wn, and the relatively long metal wire 20Bn has a relatively narrow line width W1. In both of two groups of metal wires 20 extended in two different directions, the wiring spaces S1 through Sn are set to be increased as being closer to the outermost wiring space S1 from the innermost wiring space Sn. Therefore, in each group of metal wires 20, the difference in the wiring capacitance between adjacent metal wires 20 can be decreased. In addition, by shaping the wiring chip 13 to be triangular, the mounting area of the wiring chip 13 can be reduced and thus the cost of the MCP can be more reduced.

The wiring chip 13 described above as an example in the ninth embodiment is obtained by cutting the quadrangular wiring chip in the sixth embodiment along a diagonal line thereof. The triangular shape is not limited to being applied to the wiring chip 13 in the sixth embodiment, but is also applicable to the wiring chips 13 in FIG. 1, FIG. 4, FIG. 5, FIG. 7 and FIG. 8, with the line width W, the wiring pitch P or the like being adjusted.

As described above, as the number of chips stacked in the MCP is increased, the number of wires required for connecting the chips is increased. As described above, there is a tendency to reduce the wiring pitch P of the wiring chip 13 to increase the number of metal wires in the wiring chip 13 while reducing the size of the wiring chip 13 as demanded. As the number of metal wires is increased, the variance in the length of the metal wires is increased between an inner area and an outer area of the wiring chip 13. This may possibly increase the variance in the capacitance per unit length between the metal wire and the wiring chip substrate. The metal wires are formed on the wiring chip substrate with an insulating film being interposed therebetween. It is now found that the thickness of the insulating film influences the variance in the capacitance per unit length between the metal wire and the wiring chip substrate.

The electrostatic capacitance C per unit area between the metal wire and the wiring chip substrate is derived from the following expression (1).

$$C = \varepsilon S/t = \varepsilon_0 \cdot \varepsilon_S \cdot S/t \, [F] \quad (1),$$

where $\varepsilon_0$ is the dielectric constant of vacuum [F/m]; $\varepsilon_S$ is the relative dielectric constant of the insulating film between the metal wire and the wiring chip substrate; S is the area of parallel plates facing each other between the metal wire and the wiring chip substrate; and t is the thickness of the insulating film [m].

Figure 26:
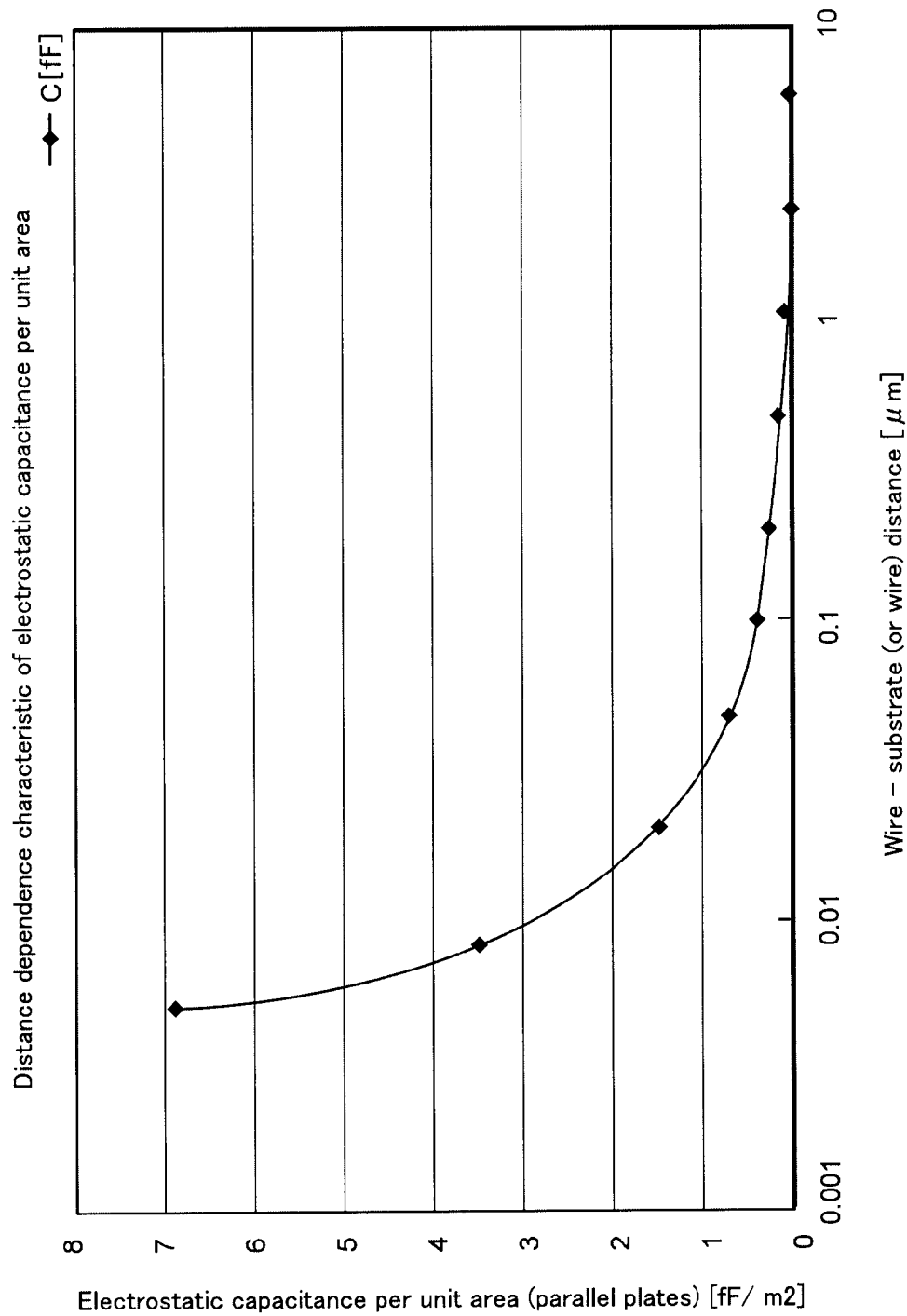
FIG. 26 is a graph showing an exemplary distance dependence characteristic of the electrostatic capacitance per unit area between the metal wire and the wiring chip substrate according to the ninth embodiment of the present invention.

FIG. 26 shows the relationship between the thickness t of the insulating film and the electrostatic capacitance C per unit area. In FIG. 26, the vertical axis represents the electrostatic capacitance [fF/μm$^2$] per unit area of parallel plates facing each other which are assumed to be the metal wire and the wiring chip substrate, and the horizontal axis represents the distance between the metal wire and the wiring chip substrate (i.e., the thickness t of the insulting film) [μm]. In FIG. 26, when the thickness t of the insulating film is 0.01 to 0.1 [μm], the electrostatic capacitance C is about 7 to about 0.3 [fF/μm$^2$]. When the thickness t of the insulating film is 0.1 [μm] or greater, the electrostatic capacitance C is about 0.3 [fF/μm$^2$] or less. Accordingly, by setting the thickness t of the insulating film to be 0.1 [μm] or greater, the variance in the capacitance per unit length between the metal wire and the wiring chip substrate can be suppressed.

Where the wiring pitch P is narrowed as the number of the metal wires in the wiring chip 13 is increased, the variance in the capacitance per unit length between the metal wire and the wiring chip substrate can be suppressed by adjusting the thickness t of the insulating film to be 0.1 [μm] or greater.

Thus, it is effective to adjust the thickness of the insulating film provided between the metal wires and the wiring chip substrate in addition to considering the line width W adjustable at the time of designing, the wiring space S adjustable at the time of designing and the wiring pitch P adjustable at the time of designing. By providing the metal wires 20 in the wiring chip 13 in a trapezoid upper shape, by appropriately combining the line width W adjustable at the time of designing, the wiring space S adjustable at the time of designing and the wiring pitch P adjustable at the time of designing, and also by adjusting the thickness of the insulating film, the difference in the wiring capacitance and the difference in the wiring resistance between adjacent metal wires can be suppressed.

The graph in FIG. 26 shows the distance dependence characteristic of the electrostatic capacitance per unit area in the case where silicon is used as the material of the wiring chip substrate and $SiO_2$ is used as the material of the insulating film. The material of the wiring chip substrate is not limited to silicon and may be, for example, a polyimide material or a glass epoxy material. The material of the insulating film is not limited to $SiO_2$ and may be, for example, any insulating material suitable to a polyimide material, a glass epoxy material or other materials used for the wiring chip substrate.

The adjustment of the thickness of the insulating film is also applicable to the first through eighth embodiments.

We claim:

1. A semiconductor device, comprising:
   a circuit substrate including at least n (n is an integer of two or greater) number of terminals;
   a semiconductor chip provided on the circuit substrate and including at least n number of terminals; and
   a relay chip including a triangular substrate having a first side, a second side and a third side, the third side being the longest side of the triangular substrate, at least n number of first terminals located along the first side, at least n number of second terminals located along the second side, and a plurality of wires located horizontally parallel to the third side and connecting the first terminals and the second terminals respectively;
   a first wire connecting each of the at least n number of terminals of the circuit substrate to a corresponding first terminal among the at least n number of first terminals; and
   a second wire connecting each of the at least n number of terminals of the semiconductor chip to a corresponding second terminal among the at least n number of second terminals,
   wherein the plurality of wires connecting the first terminals and the second terminals each include a first part drawn from each of the plurality of the first terminals inwardly so as to be horizontally parallel to, or to form an acute angle with, the second side, a second part drawn from each of the second terminals inwardly so as to be horizontally parallel to, or to form an acute angle with, the first side, and a third part connecting the first part and the second part to each other in a straight manner; and
   the plurality of wires are formed horizontally such that a wiring width of each wire, a wiring interval between each wire and a wire adjacent and outer thereto, and a wiring pitch which is a sum of each wiring width and a corresponding wiring interval are set so as to minimize a difference between wiring capacitances of each adjacent wires among the plurality of wires.

2. A semiconductor device according to claim 1, wherein the plurality of wires of the relay chip are formed on the circuit substrate with an insulating film being interposed therebetween, and the insulating film has such a thickness that minimizes a difference between wiring capacitances of each adjacent wires among the plurality of wires.

3. A semiconductor device according to claim 1, wherein the relay chip is provided on the circuit substrate.

4. A semiconductor device according to claim 1, wherein the relay chip is provided on the semiconductor chip.

5. A semiconductor device according to claim 1, wherein the plurality of wires are formed horizontally such that the wiring width of each wire sequentially decreases, such that the wiring interval between each wire and a wire adjacent and outer thereto sequentially increases, and such that the wiring pitch which is the sum of each wiring width and the corresponding wiring interval sequentially increases, from a corner which is formed by the first side and the second side to the third side.

6. A semiconductor device according to claim 1, wherein the plurality of wires are formed horizontally such that the wiring width of each wire sequentially increases, such that the wiring interval between each wire and a wire adjacent and outer thereto sequentially increases, and such that the wiring pitch which is the sum of each wiring width and the corresponding wiring interval sequentially increases, from a corner which is formed by the first side and the second side to the third side.

7. A semiconductor device according to claim 1, wherein the plurality of wires are formed horizontally such that the wiring width of each wire sequentially decreases and such that the wiring interval between each wire and a wire adjacent and outer thereto sequentially increases, from a corner which is formed by the first side and the second side to the third side, and such that the wiring pitch which is the sum of each wiring width and the corresponding interval is the same.

8. A semiconductor device according to claim 1, wherein the plurality of wires are arranged with a wiring width adjustable at a time of designing.

9. A semiconductor device according to claim 1, wherein the plurality of wires are arranged with a wiring interval adjustable at a time of designing.

10. A semiconductor device according to claim 1, wherein the plurality of wires are arranged with a wiring pitch adjustable at a time of designing, the pitch being a sum of the wiring width and the wiring interval.

11. A semiconductor device according to claim 1, wherein the plurality of wires are arranged with a wiring width adjustable at a time of designing, a wiring interval adjustable at the time of designing and a wiring pitch adjustable at the time of designing, the pitch being a sum of the wiring width and the wiring interval.

* * * * *